(12) United States Patent
Yang et al.

(10) Patent No.: US 12,538,558 B2
(45) Date of Patent: Jan. 27, 2026

(54) SOURCE/DRAIN EPITAXIAL STRUCTURES FOR HIGH VOLTAGE TRANSISTORS

(71) Applicant: TAIWAN SEMICONDUCTOR MANUFACTURING Company, LTD., Hsinchu (TW)

(72) Inventors: Sung-Hsin Yang, Hsinchu (TW); Jung-Chi Jeng, Tainan (TW); Ru-Shang Hsiao, Jhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 187 days.

(21) Appl. No.: 17/107,091

(22) Filed: Nov. 30, 2020

(65) Prior Publication Data
US 2021/0343596 A1    Nov. 4, 2021

Related U.S. Application Data

(60) Provisional application No. 63/017,306, filed on Apr. 29, 2020.

(51) Int. Cl.
*H10D 84/01*    (2025.01)
*H10D 84/03*    (2025.01)

(52) U.S. Cl.
CPC ....... *H10D 84/013* (2025.01); *H10D 84/0158* (2025.01); *H10D 84/038* (2025.01)

(58) Field of Classification Search
CPC ......... H01L 21/823431; H01L 27/0886; H01L 27/1211; H01L 29/41791; H01L 29/66795;
(Continued)

(56) References Cited

U.S. PATENT DOCUMENTS

| 7,015,116 B1 | 3/2006 | Lo et al. |
| 8,962,400 B2 * | 2/2015 | Tsai ..................... H01L 29/7848 438/300 |

(Continued)

FOREIGN PATENT DOCUMENTS

| CN | 107068754 A | 8/2017 |
| CN | 108122775 A | 6/2018 |

(Continued)

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.

(Continued)

*Primary Examiner* — Mary A Wilczewski
(74) *Attorney, Agent, or Firm* — Sterne, Kessler, Goldstein & Fox P.L.L.C.

(57) ABSTRACT

The present disclosure describes a method for the formation of n-type and p-type epitaxial source/drain structures with substantially co-planar top surfaces and different depths across input/output (I/O) and non-I/O regions of a substrate. In some embodiments, the method includes forming fin structures and a planar portion on a substrate. The method also includes forming first gate structures on the fin structures and second gate structures on the planar portion. The method also includes etching the fin structures between the first gate structures to form first openings and etching the planar portion between the second gate structures to form second openings. Further, the method includes forming first epitaxial structures in the first openings and second epitaxial structures in the second openings, where top surfaces of the first and second epitaxial structures are substantially co-
(Continued)

planar and bottom surfaces of the first and second epitaxial structures are not co-planar.

20 Claims, 20 Drawing Sheets

(58) Field of Classification Search
CPC .............. H01L 29/785; H01L 29/66636; H01L 21/823418; H01L 21/823412; H01L 21/823814; H01L 29/0847; H01L 27/0922; H01L 29/7848; H01L 29/165; H10D 30/024; H10D 30/62; H10D 84/0158; H10D 84/0193; H10D 84/834; H10D 84/853; H10D 86/011; H10D 86/215; H10D 84/013; H10D 84/017; H10D 62/021; H10D 84/856
See application file for complete search history.

(56) References Cited

U.S. PATENT DOCUMENTS

| | | | |
|---|---|---|---|
| 9,093,514 B2 | 7/2015 | Tsai et al. | |
| 9,093,530 B2 | 7/2015 | Huang et al. | |
| 9,166,024 B2* | 10/2015 | Hung | H01L 21/823814 |
| 9,171,929 B2 | 10/2015 | Lee et al. | |
| 9,214,555 B2 | 12/2015 | Oxland et al. | |
| 9,236,267 B2 | 1/2016 | De et al. | |
| 9,245,805 B2* | 1/2016 | Yeh | H01L 29/6681 |
| 9,324,570 B1* | 4/2016 | Liou | H01L 29/66795 |
| 9,418,897 B1 | 8/2016 | Ching et al. | |
| 9,461,044 B1 | 10/2016 | Chang et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 9,627,480 B2* | 4/2017 | Chou | H01L 29/0649 |
| 9,812,363 B1 | 11/2017 | Liao et al. | |
| 9,859,380 B2 | 1/2018 | Lee et al. | |
| 10,043,718 B1* | 8/2018 | Chen | H01L 29/66636 |
| 10,121,791 B2* | 11/2018 | Yu | H01L 29/0847 |
| 10,256,237 B2* | 4/2019 | Lee | H10B 10/12 |
| 10,672,764 B2* | 6/2020 | Kim | H01L 21/823431 |
| 2012/0001238 A1 | 1/2012 | Tsai et al. | |
| 2013/0049136 A1* | 2/2013 | Wahl | H01L 27/1207 257/E27.06 |
| 2013/0122676 A1* | 5/2013 | Jeng | H01L 21/823821 257/E21.409 |
| 2015/0091059 A1* | 4/2015 | Hung | H01L 29/785 257/192 |
| 2015/0206955 A1* | 7/2015 | Kim | H01L 29/517 438/285 |
| 2015/0380488 A1* | 12/2015 | Chou | H01L 21/30604 438/151 |
| 2016/0093537 A1* | 3/2016 | Chen | H01L 21/32136 438/283 |
| 2016/0133703 A1* | 5/2016 | Chang | H01L 21/823431 257/349 |
| 2017/0323831 A1* | 11/2017 | Jeong | H01L 21/823878 |
| 2018/0040618 A1 | 2/2018 | Lee et al. | |
| 2018/0182756 A1* | 6/2018 | Lee | H01L 29/0649 |
| 2018/0211959 A1* | 7/2018 | Yu | H01L 29/66636 |
| 2019/0006351 A1 | 1/2019 | Zhou | |
| 2019/0006392 A1* | 1/2019 | Liu | H01L 21/823821 |
| 2019/0067125 A1 | 2/2019 | Chiang et al. | |
| 2019/0109217 A1 | 4/2019 | Lin et al. | |
| 2019/0252376 A1* | 8/2019 | Kim | H01L 29/78 |
| 2020/0091285 A1 | 3/2020 | Hafez et al. | |
| 2020/0152461 A1* | 5/2020 | Kim | H01L 21/823431 |
| 2021/0343596 A1* | 11/2021 | Yang | H01L 21/823412 |
| 2022/0302114 A1* | 9/2022 | Chuang | H01L 21/823878 |
| 2022/0359684 A1* | 11/2022 | Hsiung | H01L 29/7851 |

FOREIGN PATENT DOCUMENTS

| | | |
|---|---|---|
| CN | 109427905 A | 3/2019 |
| CN | 110970365 A | 4/2020 |
| CN | 110970489 A | 4/2020 |
| WO | WO 2020/021913 A1 | 1/2020 |

OTHER PUBLICATIONS

Luo, Jie-Xin, et. al., "The Impact of Shallow-Trench-Isolation Mechanical Stress on the Hysteresis Effect of Partially Depleted Silicon-on-Insulator n-Type Metal-Oxide-Semiconductor Field Effects," Chin.Phys.Lett. vol. 31, No. 12 (2014) 126601, 4 pages.

Yang, Wenwei, et al., "Analysis of GIDL Dependence on STI-induced Mechanical Stress." Institute of Microelectronics, Tsinghua University, Beijing, China, (2005), 4 pages.

\* cited by examiner

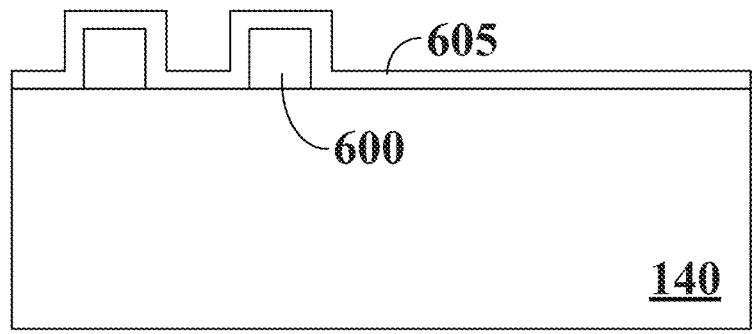
FIG. 6
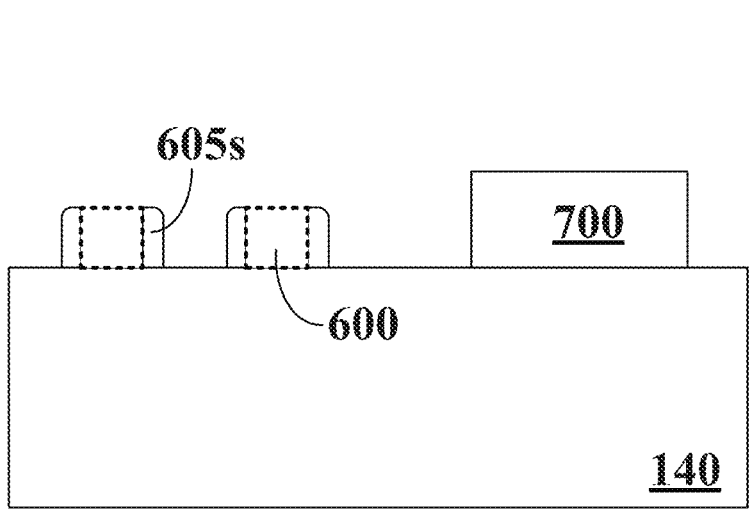
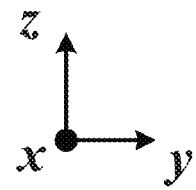
FIG. 7
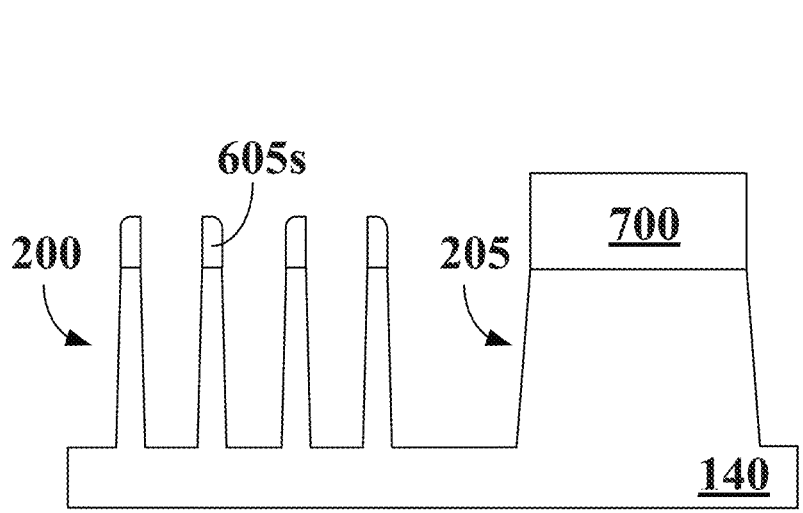
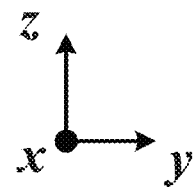
FIG. 8

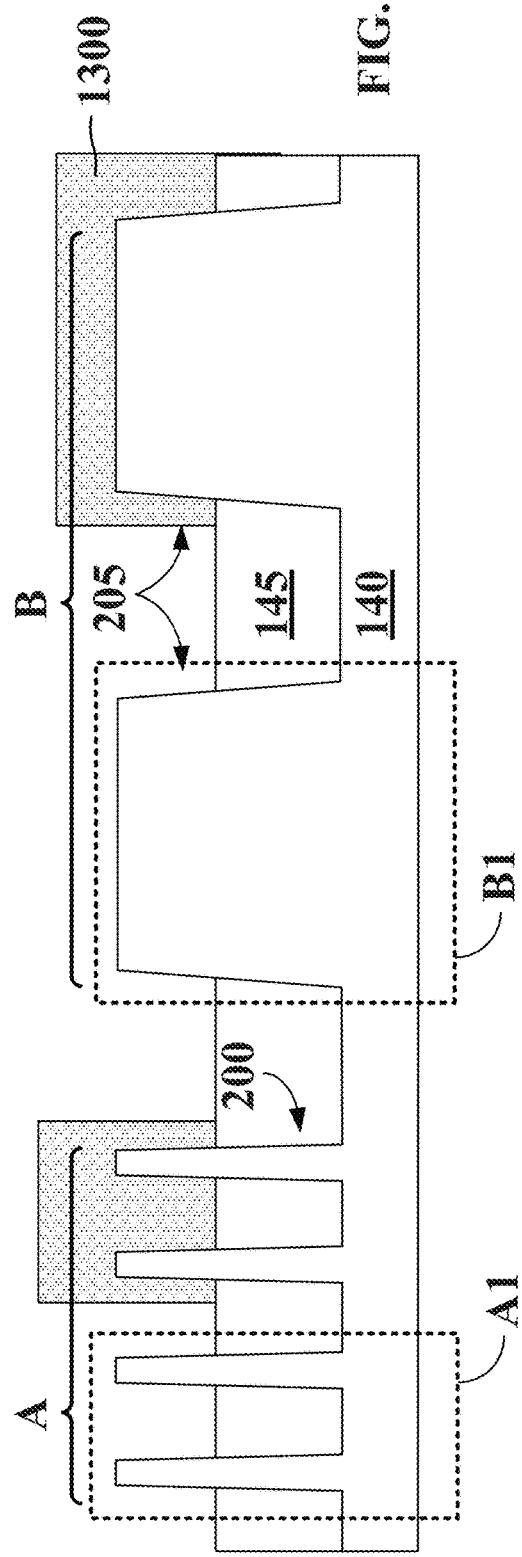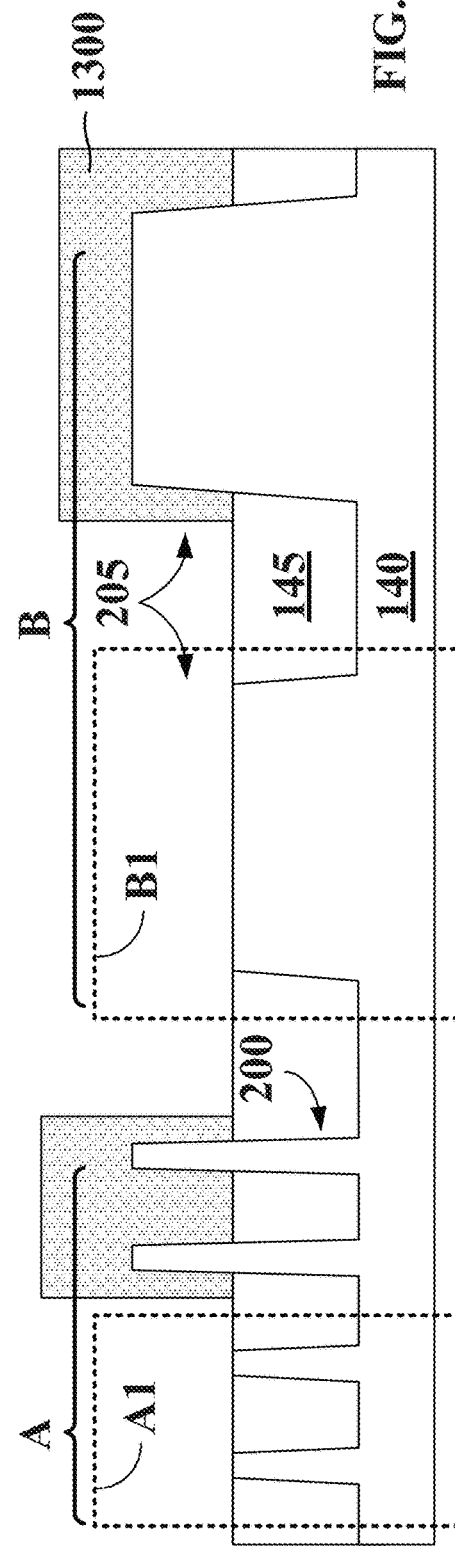

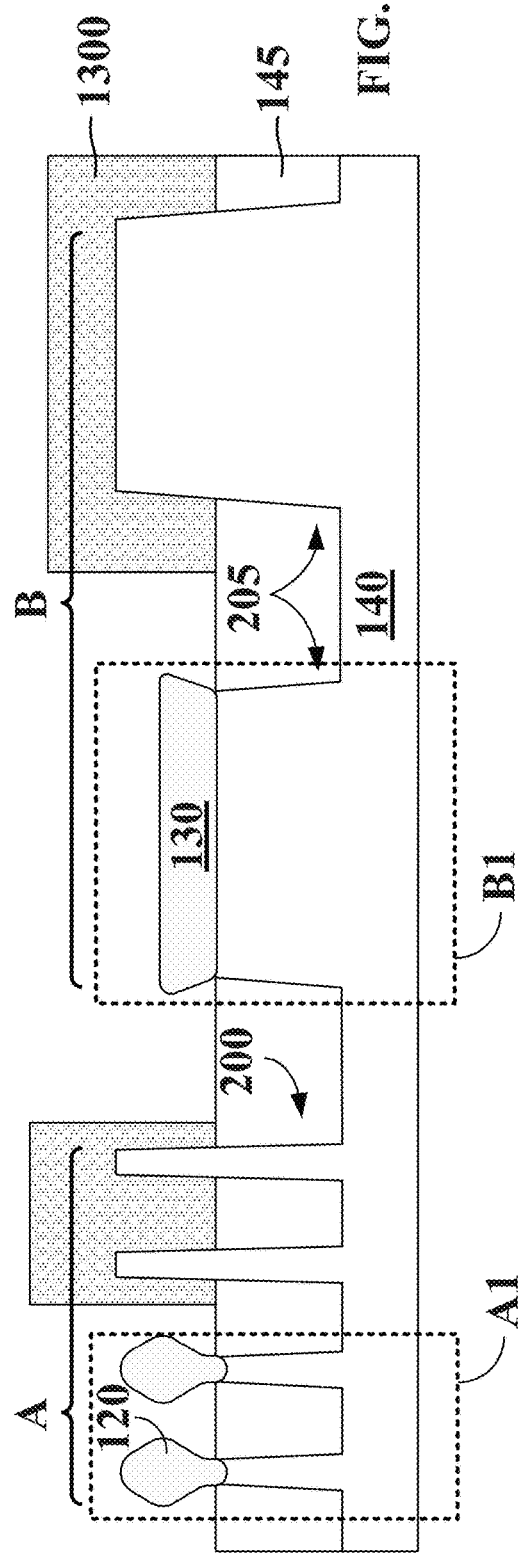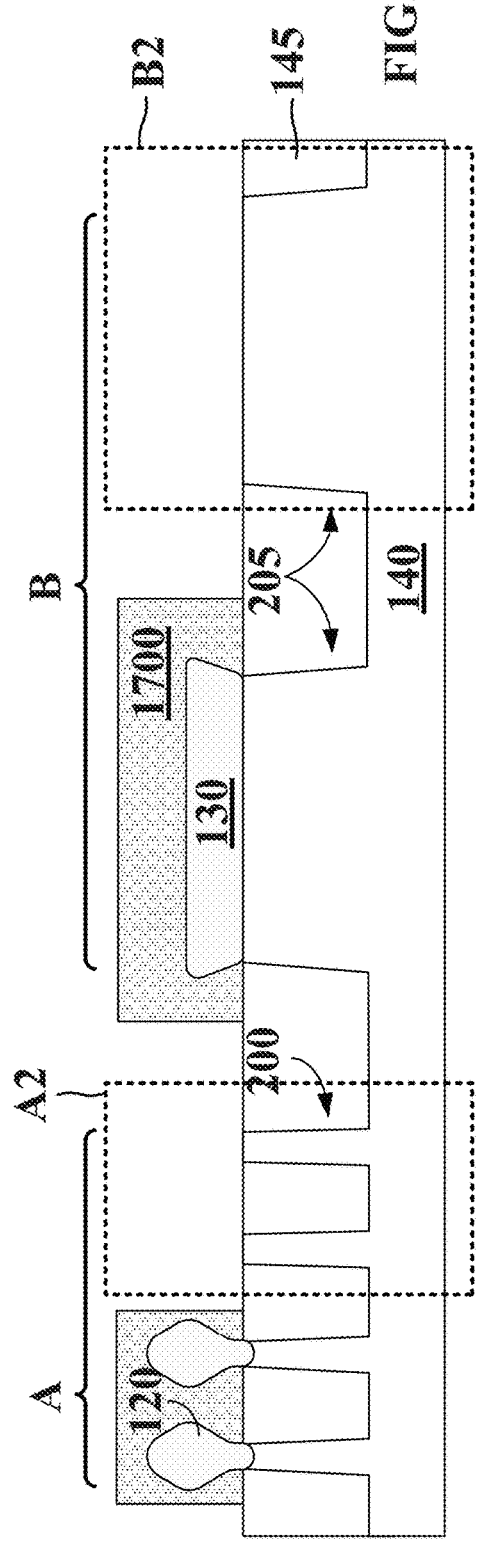

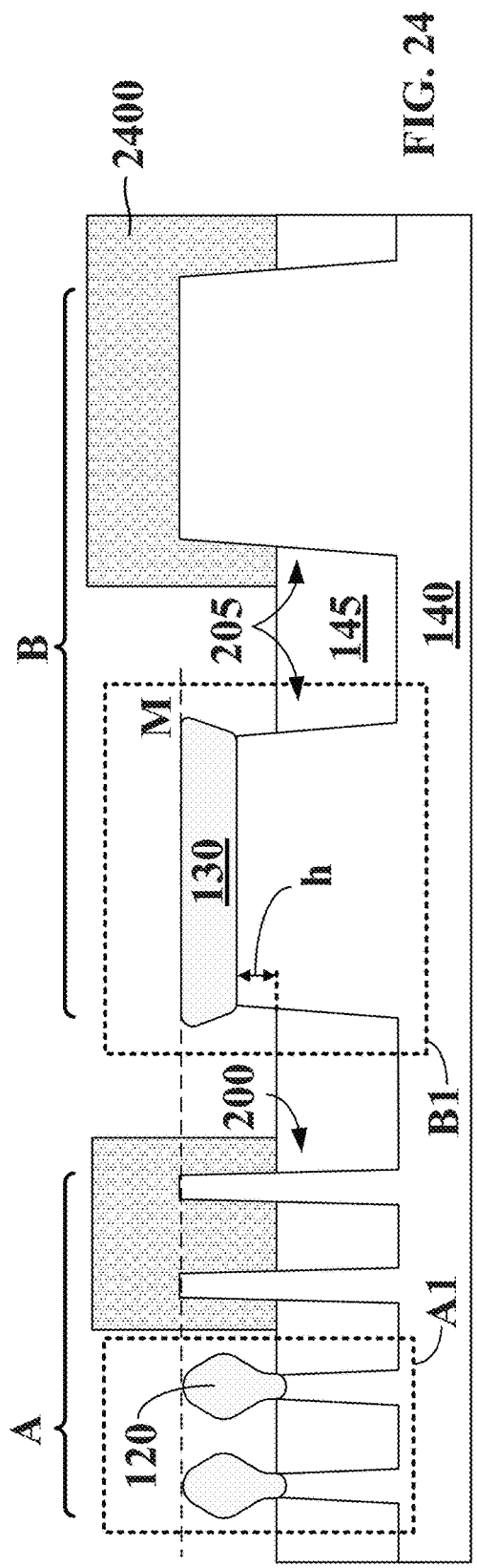
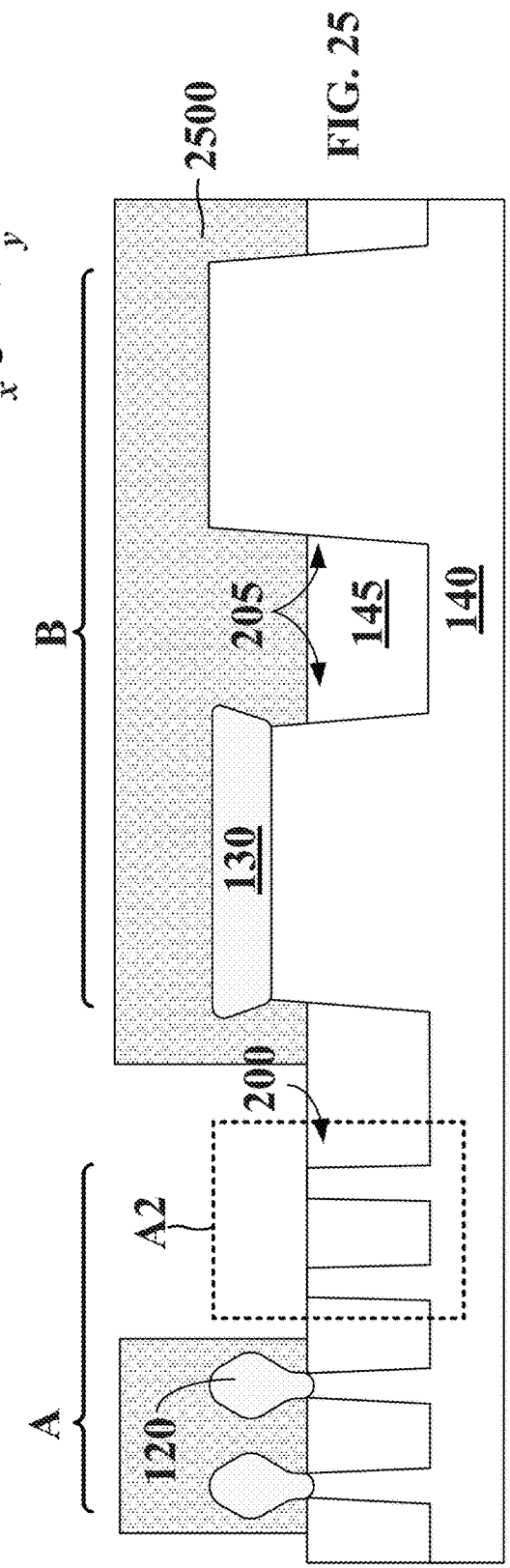

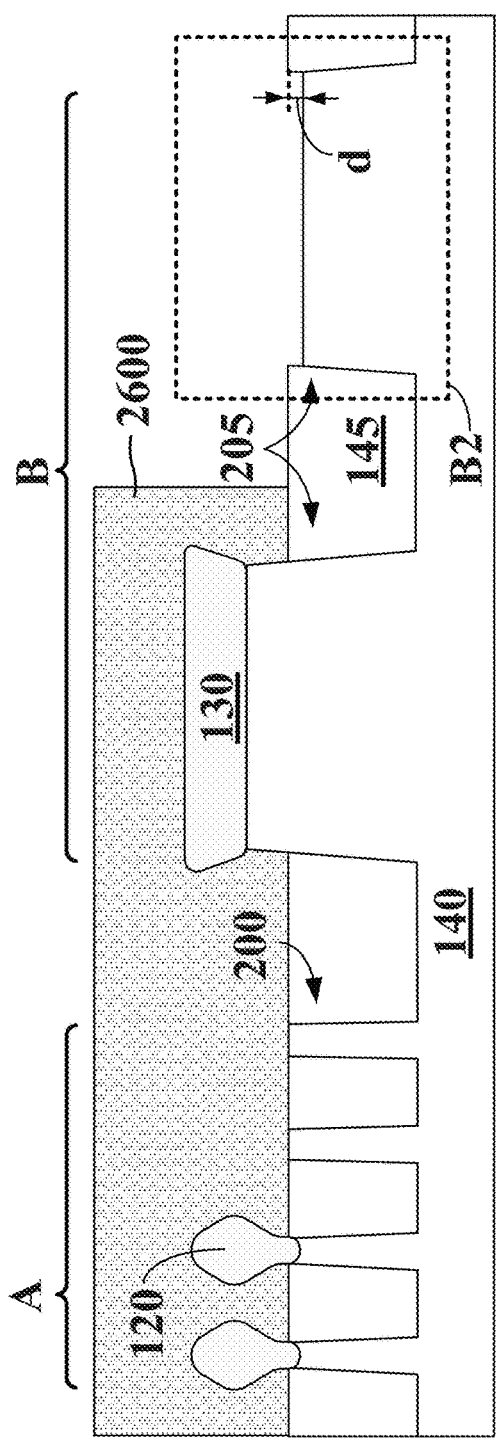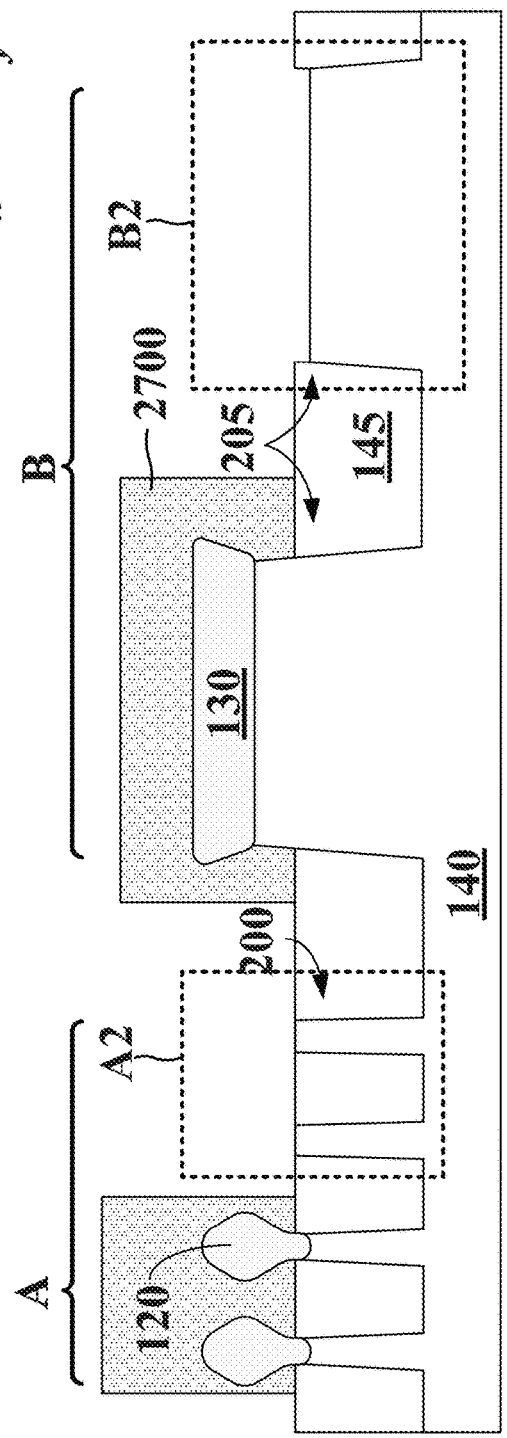

SOURCE/DRAIN EPITAXIAL STRUCTURES FOR HIGH VOLTAGE TRANSISTORS

CROSS-REFERENCE TO RELATED APPLICATION

This application claims the benefit of U.S. Provisional Patent Application No. 63/017,306, titled "Dual Source/Drain Proximity and Epitaxial Structure Height Modulation in MOSFETs," which was filed on Apr. 29, 2020 and is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

FIGS. 6-9 are cross-sectional views of intermediate structures during the formation of non-I/O and I/O regions, in accordance with some embodiments.

FIGS. 13 and 14 are cross-sectional views of intermediate structures during the formation of S/D epitaxial structures with a substantially similar depth in non-I/O and I/O regions, in accordance with some embodiments.

FIGS. 16 and 17 are cross-sectional views of intermediate structures during the formation of S/D epitaxial structures with a substantially similar depth in non-I/O and I/O regions, in accordance with some embodiments.

FIGS. 24-27 are cross-sectional views of intermediate structures during the formation of S/D epitaxial structures with a co-planar top surface topography across non-I/O and I/O regions, in accordance with some embodiments.

DETAILED DESCRIPTION

Figure 1:
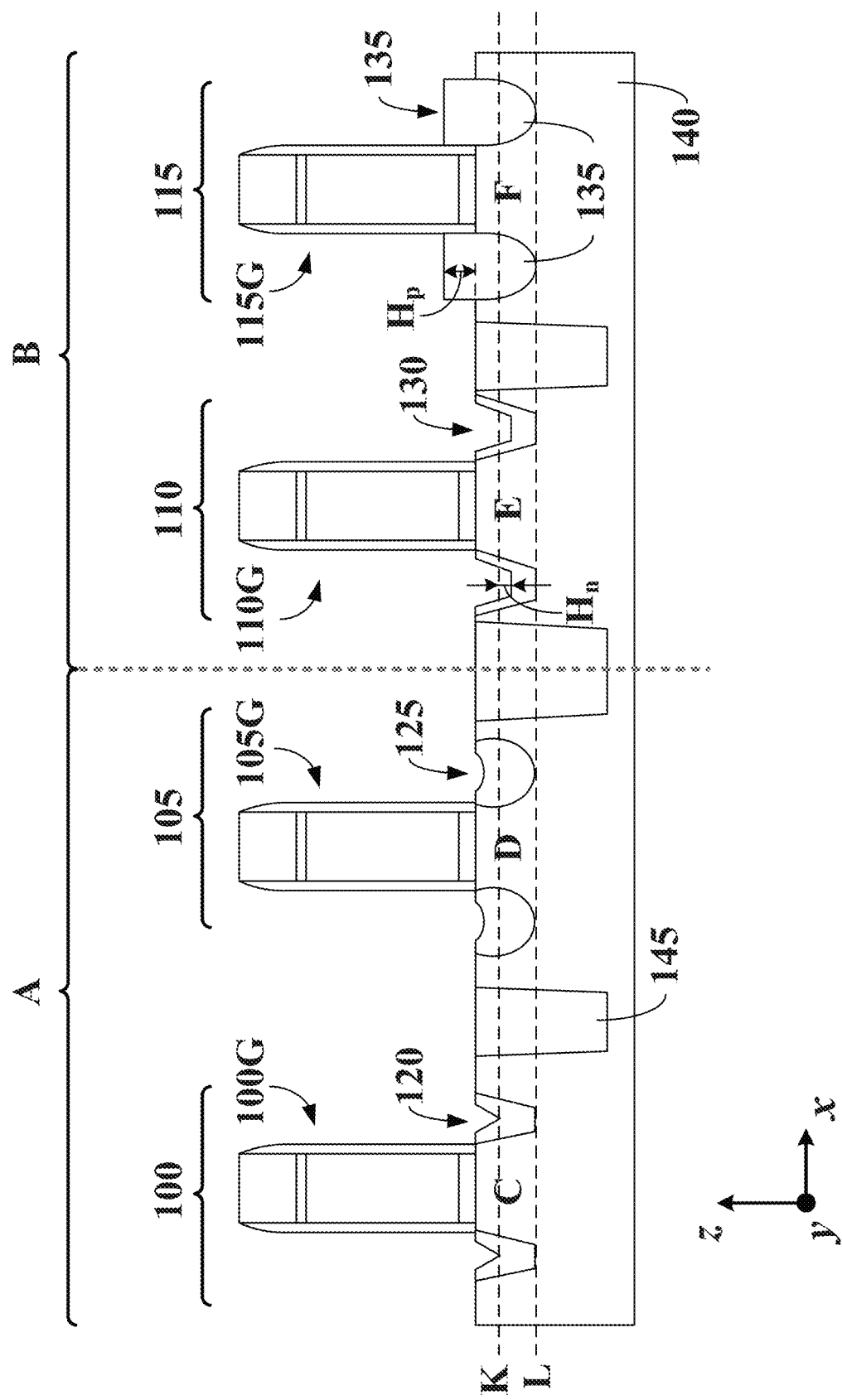
FIG. 1 is a cross-sectional view of transistors in non-input/output (non-I/O) and I/O regions with source/drain (S/D) epitaxial structures formed at a substantially similar depth, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature on a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, the terms "about" and "substantially" can indicate a value of a given quantity that varies within 5% of the value (e.g., ±1%, ±2%, ±3%, ±4%, ±5%) of the value). These values are merely examples and are not intended to be limiting. The terms "about" and "substantially" can refer to a percentage of the values as interpreted by those skilled in relevant art(s) in light of the teachings herein.

The term "vertical," as used herein, means nominally perpendicular to the surface of a substrate.

Integrated circuits (IC) can include combinations of semiconductor structures like input/output (I/O) field-effecttransistors (FETs) and non-I/O FETs. The I/O FETs can be part, for example, of a circuit formed in a peripheral region of the IC referred to as an "I/O region" or a "high voltage region," while the non-I/O devices can be part of a "core" circuit referred to as a logic circuit and/or a memory circuit formed in a "core" region of the IC. The I/O devices can be configured to tolerate a higher voltage or current than the non-I/O devices. For example, the I/O devices can be configured to handle input voltages from an external power supply, such as a lithium ion battery, outputting about 5 V. Further, the I/O devices can be part of a transformer circuit that outputs a distribution voltage of about 1 V, which can be subsequently distributed to the non-I/O FETs. On the other hand, the non-I/O devices are not configured to handle the I/O voltages/current directly. The non-I/O devices can include FETs forming logic gates, such as NAND, NOR, inverters, and a combination thereof. Additionally, the non-I/O devices can include memory devices, such as static random-access memory (SRAM) devices, dynamic random-access memory (DRAM) devices, other types of memory devices, and combinations thereof.

For fabrication efficiency, it is desirable that I/O and non-I/O FETs are formed concurrently on the same substrate. Metal gate materials and high-dielectric constant (high-k) dielectric materials (e.g., with a k-value greater than about 3.9) have been implemented in the gate stack fabrication of the non-I/O FETs to improve the device characteristics and promote device scaling. To simplify, harmonize, and streamline the fabrication process between I/O and non-I/O FETs, metal gate and high-k dielectric materials have also been implemented for the gate stacks of I/O FETs.

Because the I/O and non-I/O FETs are configured to operate at different voltages (e.g., at about 5 V and about 2 V respectively), their structures can vary significantly in terms of their physical dimensions (e.g., length, width, and height). For example, the gate stack of the I/O FETs can have a larger surface area (e.g., greater than about 2 $\mu m^2$) and include a thicker gate oxide compared to the gate stack of the non-I/O FETs, which are smaller in size. Other structural differences between the I/O and non-I/O FETs include the height of their respective source/drain (S/D) epitaxial structures. For example, due to the large size of the I/O FETs, S/D openings formed in the substrate to facilitate the formation of their S/D epitaxial structures are larger than the openings formed for the S/D epitaxial structures of non-I/O FETs. Consequently, and based on the growth characteristics of the S/D epitaxial structures, the resulting S/D epitaxial structures for I/O FETs can be larger or smaller than those for non-I/O FETs. By way of example, p-type S/D epitaxial structures for I/O FETs can be taller than the p-type S/D epitaxial structures for non-I/O FETs. Meanwhile, n-type S/D epitaxial structures for I/O FETs can be shorter than the n-type S/D epitaxial structures for non-I/O FETs. The aforementioned size difference correlates to the height and the electrical resistance of the S/D contacts formed on the S/D epitaxial structures and can lead to an appreciable resistance variation between the S/D contacts formed in I/O and non-I/O areas of the IC.

Further, because I/O FETs operate at higher input voltages (e.g., between about 3.3 V to about 5 V) than non-I/O FETs, FETs can become susceptible to hot carrier injection (HCI). HCI occurs when carriers from the channel region are accelerated towards the substrate (e.g., in the form of leakage current) or the surrounding dielectric materials due to the presence of high electric fields in the vicinity of the drain terminal. Side effects of HCI include leakage current and damage to the surrounding dielectric materials (including the gate dielectric) if the "hot carrier" damages the atomic structure of the dielectric.

Embodiments of the present disclosure are directed to methods for the formation of I/O FETs that are less susceptible to HCI. In some embodiments, mitigation of HCI is achieved by changing the sidewall profile of S/D openings in I/O FETs to increase the spacing between the S/D epitaxial structures and the channel region. In some embodiments, the I/O FETs formed with the methods described herein feature n-type and p-type S/D epitaxial structures with co-planar top surfaces. In some embodiments, n-type and p-type S/D epitaxial structures formed in I/O and non-I/O regions of a substrate have co-planar top surfaces. In some embodiments, the aforementioned co-planarity is achieved by adjusting the position of the S/D epitaxial structures for n-type and p-type I/O FETs.

According to some embodiments, FIG. 1 is a cross-sectional view of a non-I/O region A and an I/O region B of an IC. In some embodiments, non-I/O region A and I/O region B are not adjacent to each other (e.g., as shown in FIG. 1), but separated by other areas of the IC. For example, I/O region B can be part of the IC's periphery. As shown in FIG. 1, non-I/O region A can include n-type transistor 100 (also referred to as "transistor 100") and p-type transistor 105 (also referred to as "transistor 105"). I/O region B can include n-type transistor I/O (also referred to as "transistor 110") and p-type transistor 115 (also referred to as "transistor 115"). Additional transistors in both non-I/O region A and I/O region B are possible and within the spirit and the scope of this disclosure. In non-I/O region A, n-type transistor 100 includes a gate structure 100G, n-type S/D epitaxial structures 120 (also referred to as "S/D epitaxial structures 120"), and a channel region C. Similarly, p-type transistor 105 includes a gate structure 105G, p-type epitaxial structures 125 (also referred to as "S/D epitaxial structures 125"), and a channel region D. In I/O region B, n-type transistor 110 includes a gate structure 110G, n-type S/D epitaxial structures 130 (also referred to as "S/D epitaxial structures 130"), and a channel region E. Similarly, p-type transistor 115 includes a gate structure 115G, p-type S/D epitaxial structures 135 (also referred to as "S/D epitaxial structures 135"), and a channel region F. In some embodiments, transistors 100 and 105 in area A are formed on fin structures disposed on substrate 140 while transistors 110 and 115 in I/O region B are formed on planar portions of substrate 140. For example, transistors 100 and 105 in I/O area A are fin-based transistors in which channel regions C and D are formed in fin structures while transistors 110 and 115 are planar transistors in which channel regions E and F are formed on planar portions of substrate 140. As shown in FIG. 1, transistors 100, 105, 110, and 115 are isolated via isolation structures 145 formed on substrate 140.

In some embodiments, even though not shown in FIG. 1, transistors 100 and 105 in non-I/O region A have a smaller footprint than transistors 110 and 115 in I/O region B. For example, gate structures 100G and 106G are narrower along the x-direction than gate structures 110G and 115G. Further, S/D epitaxial structures 120 and 125 are narrower along the x- and y-directions than S/D epitaxial structures 130 and 135. In some embodiments, the gate pitch in non-I/O region A is smaller than the gate pitch in I/O region B. Therefore, non-I/O region A has more transistors per unit area than region B.

Figure 2:
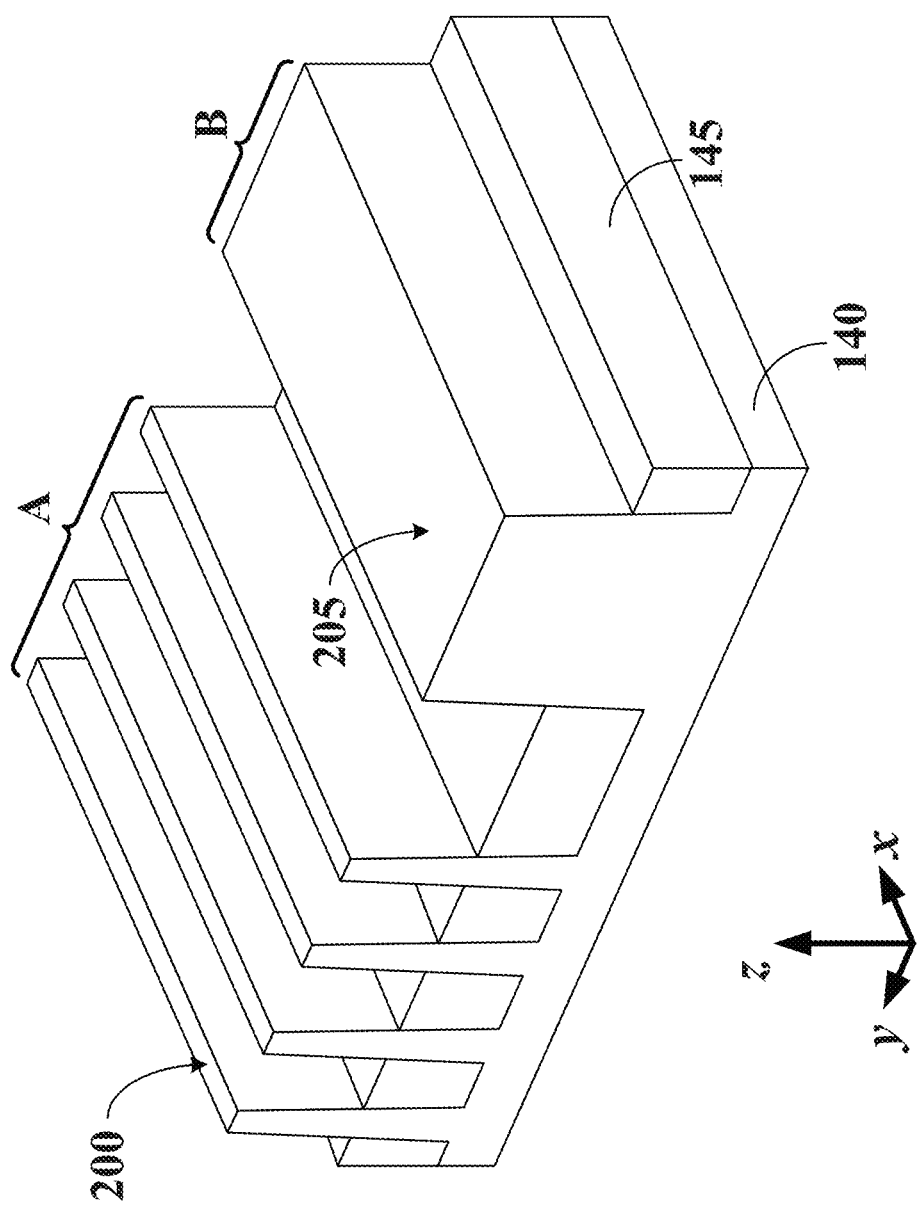
FIG. 2 is an isometric view of a non I/O region and an I/O region, in accordance with some embodiments.

By way of example and not limitation, FIG. 2 is an isometric view of non-I/O region A and I/O region B prior to the formation of transistors 100, 105, 110, and 115. According to some embodiments, transistors 100 and 105 are formed on fin structures 200 while transistors 110 and 115 are formed on planar portions 205 as discussed above.

Fin structures 200 may formed via patterning by any suitable method. For example, fin structures 200 may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, in some embodiments, a sacrificial layer is formed over substrate 140 and subsequently patterned using a photolithography process. Spacers are formed along the patterned sacrificial layer using a self-aligned process. The sacrificial layer is then removed, and the remaining spacers may then be used to pattern fin structures 200.

In referring to FIG. 1, S/D epitaxial structures 120, 125, 130 and 135 can be formed at a substantially similar depth within substrate 140 as indicated by dashed line L. However, formation of S/D epitaxial structure at different depths can result in a height difference $H_n$ between S/D epitaxial structures 120 and 130 as indicated by dashed line K, and a height different $H_p$ between S/D epitaxial structures 125 and 135. More specifically, n-type S/D epitaxial structures 130 of n-type transistor 110 are formed shorter than n-type S/D epitaxial structures 120 of n-type transistor 100, and p-type S/D epitaxial structures 135 of p-type transistor 115 are formed taller than p-type epitaxial structures 125 of p-type transistor 105. Based on the above, the height of the S/D contacts formed on p-type epitaxial structures 135 will be shorter than the height of the S/D contacts formed on S/D epitaxial structures 120 and 125. Accordingly, the height of the S/D contacts formed on n-type S/D epitaxial structures 130 will be taller than the S/D contacts formed on S/D epitaxial structures 120 and 125. The aforementioned height difference between the S/D contacts in non-I/O region A and region B can be challenging for the etching processes used in the formation of the S/D contacts and can exacerbate the contact resistance variation across the IC.

In some embodiments, height different $H_p$ between p-type epitaxial structures 125 and 135 can be about 10 nm. However, height different $H_p$ can range from 0 nm to about 30 nm. Respectively, height different Fin between n-type S/D epitaxial structures 120 and 130 can be about 15 nm. However, height different IL can range from about 0 nm to about 30 nm.

Figure 3:
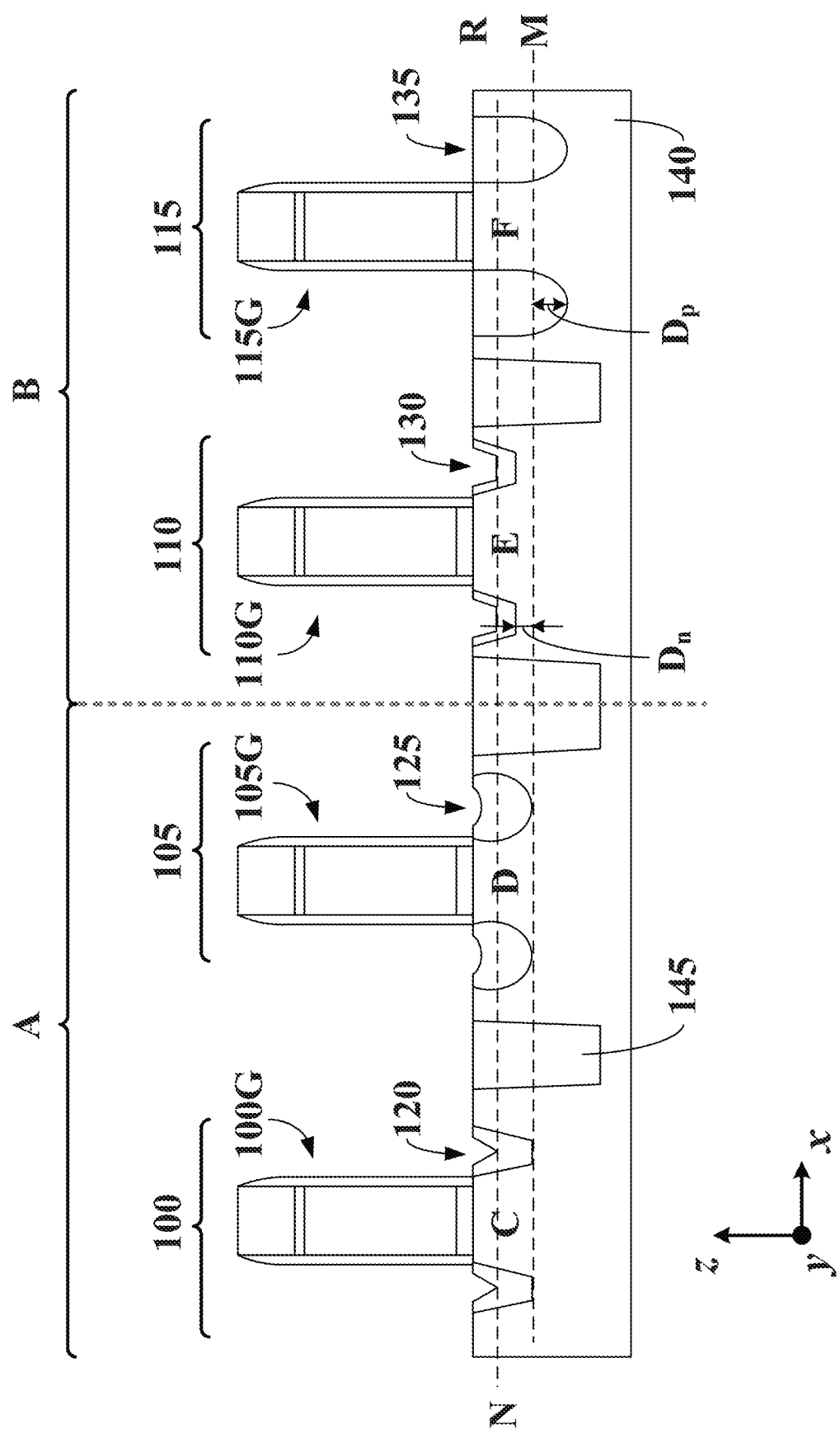
FIG. 3 is a cross-sectional view of transistors in non-I/O and I/O regions with S/D epitaxial structures formed at a different depth, in accordance with some embodiments, in accordance with some embodiments.

According to some embodiments, FIG. 3 is a cross sectional view of non-I/O region A and I/O region B where S/D epitaxial structures 130 and 135 have been positioned to achieve a substantially similar S/D contact height for the n-type transistors and for the p-type transistors in the I/O and non-I/O areas of substrate 140. More specifically, n-type S/D epitaxial structures 130 have been formed at a shorter depth $D_n$ than S/D epitaxial structures 120 as shown by dashed line M. Respectively, S/D epitaxial structures 135 have been formed at a larger depth $D_p$ than S/D epitaxial structures 125 as shown by dashed line M. As a result, top surfaces of n-type S/D epitaxial structures 120 and 130 are substantially co-planar as shown by dashed line N. In addition, top surfaces of S/D epitaxial structures 125 and 135 are also substantially co-planar.

In some embodiments, similar to FIG. 1, n-type S/D epitaxial structures 130 are shorter than n-type S/D epitaxial structures 120 and p-type S/D epitaxial structures 135 are taller than p-type S/D epitaxial structures 125. In some embodiments, depth $D_p$ shown in FIG. 3 offsets height difference $H_p$ shown in FIG. 1. For example, depth different $D_p$ shown in FIG. 3 is substantially equal to height difference $H_p$ shown in FIG. 1 (e.g., about 10 nm). In some embodiments, depth difference $D_n$ shown in FIG. 3 offsets height difference $H_p$ shown in FIG. 1. For example, depth difference $D_p$ shown in FIG. 2 is substantially equal to height difference $H_n$ shown in FIG. 1 (e.g., about 15 nm).

Figure 4:
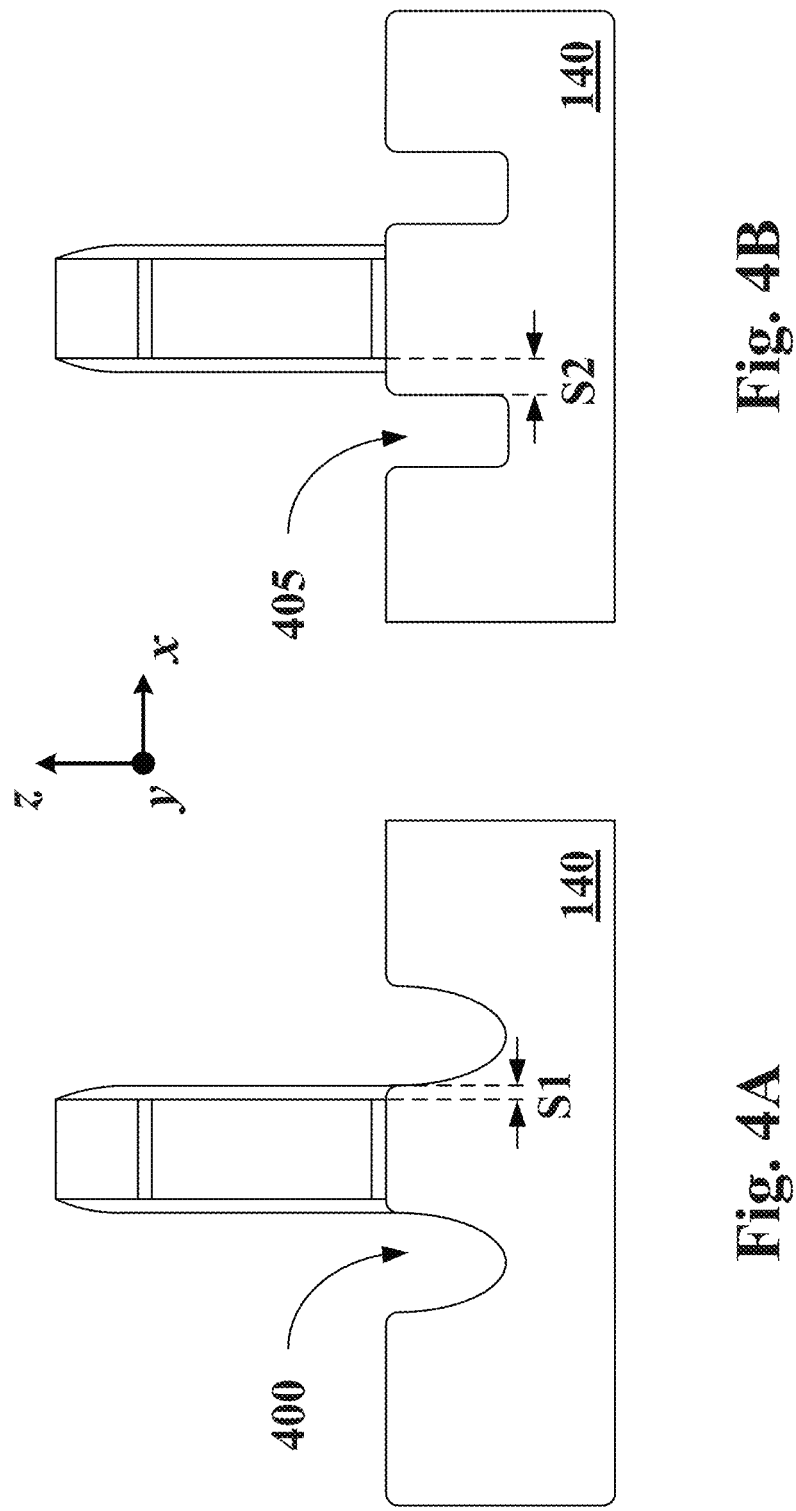
FIGS. 4A and 4B are cross-sectional views of S/D openings formed with different etching processes, in accordance with some embodiments.

In some embodiments, positioning S/D epitaxial structures 130 and 125 at different depths as shown in FIG. 3 requires the use of etching masks that permit independent control of the etching processes used between non-I/O region A and I/O region B and between the n-type and p-type transistors in I/O region B. A benefit of decoupling the etching processes between the non-I/O and regions is that the HCI effect can be addressed independently for transistors 110 and 115 in I/O region B. In some embodiments, the etching process used to form the S/D openings for transistors 110 and 115 is adjusted to increase the distance between the S/D epitaxial structures and the channel region. For example, and in referring to FIGS. 4A and 4B, the etching parameters can be modulated so that instead of forming a S/D opening 400 with spacing S1 shown in FIG. 4A, a S/D opening 405 with enlarged spacing S2 is formed as shown in FIG. 4B. In some embodiments, each spacing S1 and S2 corresponds to a horizontal distance from the edge of each S/D opening to the edge of the transistor's channel region. In some embodiments, the etching process used to form S/D opening 405 is more anisotropic than the etching process used to form S/D opening 400. Consequently, S/D opening 405 has a more vertical sidewall profile compared to S/D opening 400. In some embodiments, the difference between S2 and S1 (e.g., the "proximity gain") is about 2.8 nm for the n-type S/D epitaxial structures (e.g., S/D epitaxial structures 130 shown in FIG. 3) and about 6 nm for the p-type S/D epitaxial structures (S/D epitaxial structures 135 shown in FIG. 3).

Figure 5:
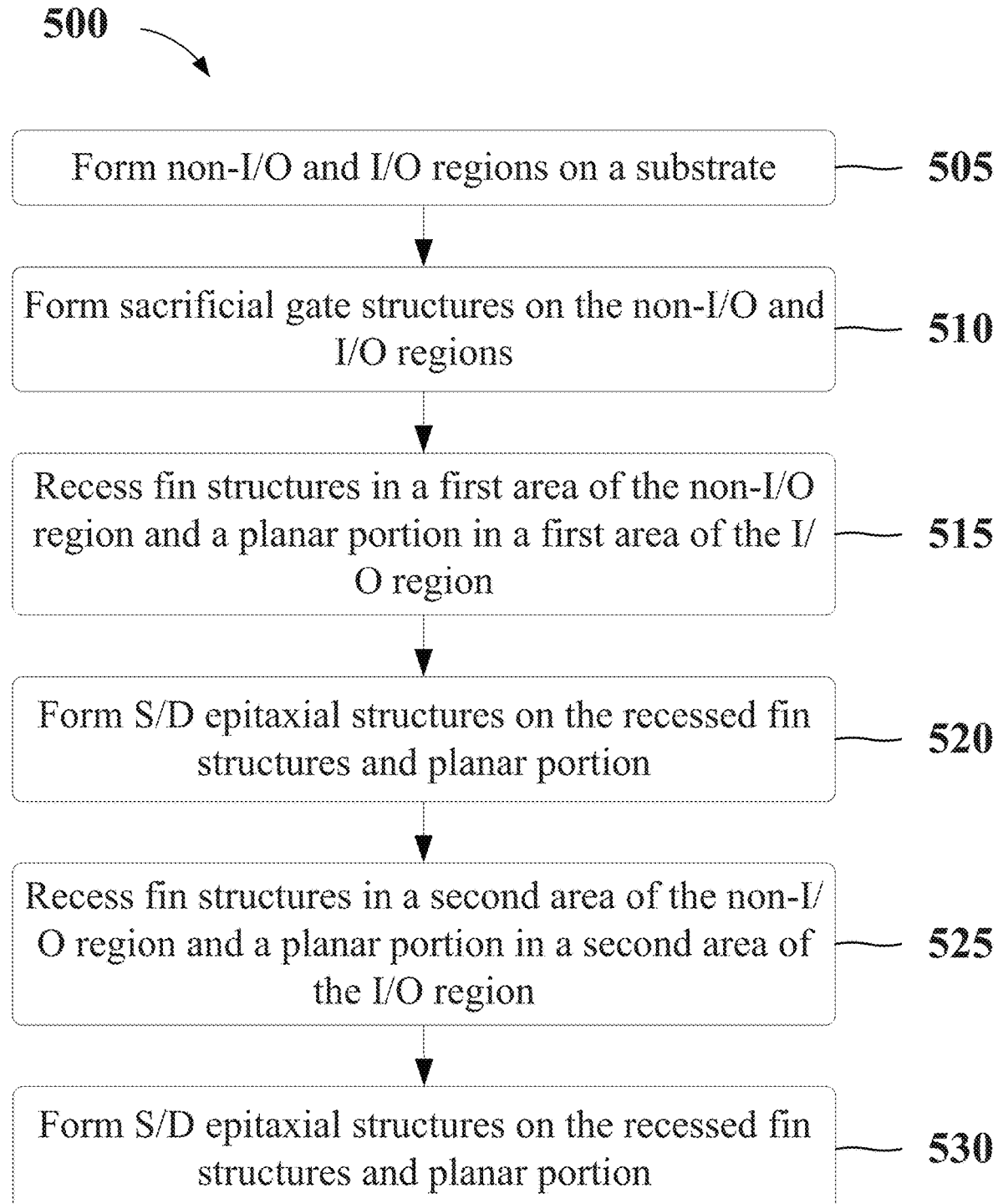
FIG. 5 is a flowchart describing a method for forming Sal) epitaxial structures at a substantially similar depth in non-I/O and I/O regions, in accordance with some embodiments.

According to some embodiments, FIG. 5 is a flowchart of a method 500 for the formation of S/D epitaxial structures in non-I/O and regions at a substantially similar depth, like S/D epitaxial structures 120, 125, 130 and 135 shown in FIG. 1. Other fabrication operations may be performed between the various operations of method 500 and may be omitted merely for clarity. Method 500 will be described in reference to FIGS. 6-18.

In referring to FIG. 5, method 500 begins with operation 505 and the process of forming non-I/O and I/O regions on a substrate. In some embodiments, non-I/O) region A and I/O region B shown in FIG. 2 are formed by operation 505. By way of example and not limitation, the formation of non-I/O region A and I/O region B will be described in reference to FIGS. 6 through 10.

As discussed above, with respect to FIG. 2, non-I/O region A includes fin structures 200 and I/O region B includes one or more planar portions 205. Fin structures 200 may be formed via patterning by any suitable method. For example, fin structures 200 may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, and in referring to FIG. 6, a sacrificial layer can be formed over substrate 140 and subsequently patterned using a photolithography process to form sacrificial patterned structures 600. Spacers 605s can be formed along the patterned sacrificial structures 600 as shown in FIG. 7 by depositing and anisotropically etching a spacer layer 605. As a result, spacers 605s become self-aligned to sidewalls of sacrificial patterned structures 600. Subsequently, sacrificial patterned structures 600 are removed, and the remaining spacers 605s may be used to pattern fin structures 200 as shown in FIG. 8. The above method can be used for example to form fin structures 200 for the n-type and p-type transistors in the non-I/O region. In some embodiments, the spacing of patterned sacrificial structures 600 and the width spacers 605s (e.g., along the y-direction) define, respectively, the pitch and the width (e.g., along the y-direction) of the resulting fin structures 200.

The formation of planar portion 205 can occur concurrently with the formation of fin structures 200 as shown in FIGS. 7 and 8. For example, as shown in FIG. 7, a hard mask layer can be deposited and patterned to form patterned structure 700. Patterned structure 700 is subsequently used as an etching mask to define planar portion 205 shown in FIG. 8. In some embodiments, multiple patterned structures 700 can be formed on substrate 140 to define planar portions, like planar portion 205. For example, planar portions for n-type and p-type transistors in the I/O region can be formed with the method described above.

Figure 9:
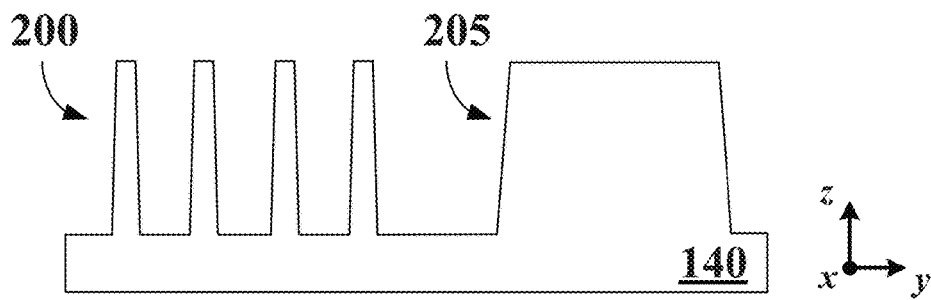
Figure 10:
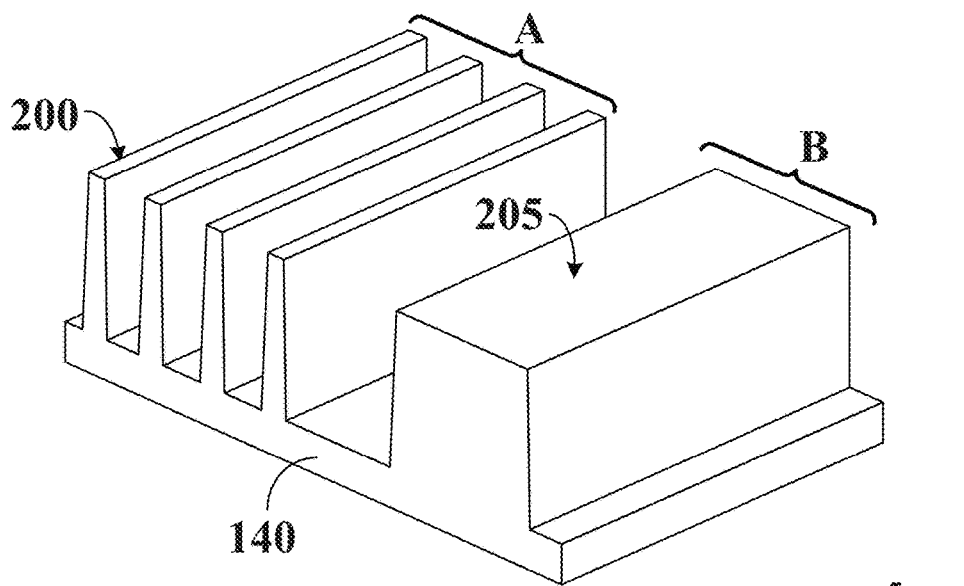
FIGS. 10 and 11 are isometric views of non-I/O and regions, in accordance with some embodiments.
Figure 11:
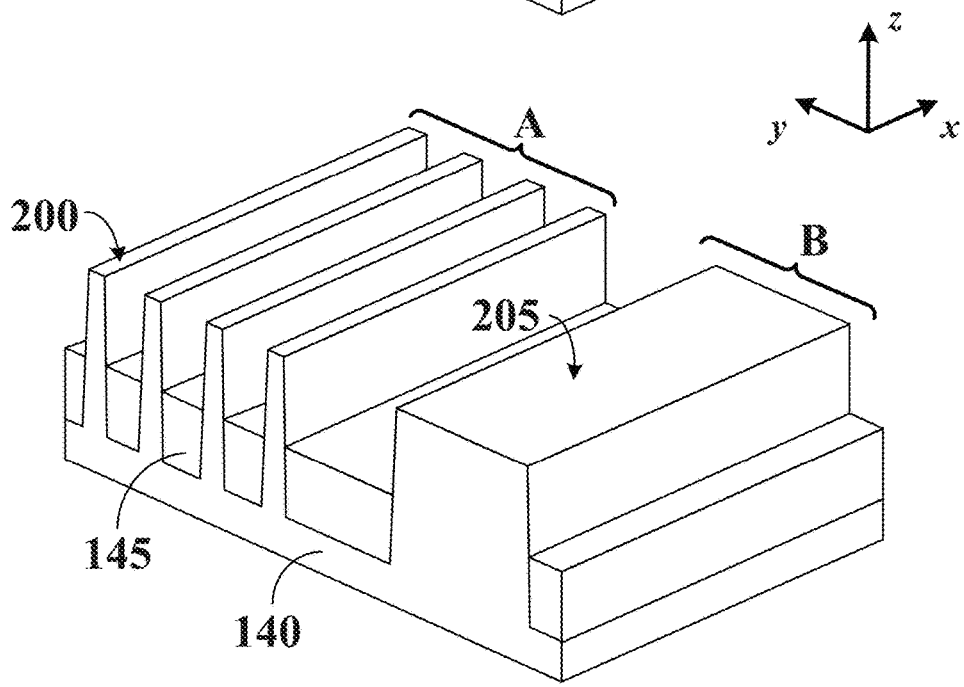

In some embodiments, after the formation of fin structures 200 and planar portion 205, spacers 605s and patterned structure 700 are removed as shown in FIG. 9. According to some embodiments, FIG. 10 is an isometric view of FIG. 9. As discussed above, non-I/O region A and I/O region B can be formed in different areas of substrate 140 for example, not next to each other as shown in FIG. 10. In some embodiments, non-I/O region A and I/O region B are shown next to each other for ease of description. Further, additional fin structures and planar portions can be formed on respective regions of substrate 140.

In some embodiments, substrate 140, fin structures 200, and planar portion 205 can include silicon, a compound semiconductor, an alloy semiconductor, or combinations thereof. Examples of compound semiconductors include, but are not limited to, gallium arsenide (GaAs), gallium phosphide (GaP), indium phosphide (InP), indium arsenide (InAs), and indium antimonide (InSb). Examples of alloy semiconductors include, but are not limited to, silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and gallium indium arsenide phosphide (GaInAsP).

In some embodiments, fin structures 200 and planar portion 205 can include different semiconductor materials from substrate 140. For example, different semiconductor materials or combinations thereof (e.g., SiGe, Ge, or SiGe/Si stacks) can be deposited on substrate 140 and subsequently patterned as described above in reference to FIGS. 6-9 to form fin structures 200, planar portion 205, or both.

For example purposes, semiconductor substrate 140, fin structures 200, and planar portion 205 will be described in the context of silicon. Based on the disclosure herein, other semiconductor materials and combinations thereof can be used. These semiconductor materials and their combinations are within the spirit and scope of this disclosure.

According to some embodiments, isolation structures 145 shown in FIG. 3 are formed after the formation of fin structures 200 and planar portion 205. By way of example and not limitation, isolation structures 145 can include a stack of dielectric layers, such as a liner dielectric layer and a fill dielectric layer, which are collectively shown in FIG. 3 as isolation structures 145. In some embodiments, the isolation material is deposited over fin structures 200 and planar portion 205 to fill the gaps between the structures disposed on substrate 140, such as fin structures 200 and planar portion 205. In some embodiments, fin structures 200 and planar portion 205 are embedded in the isolation material. By way of example and not limitation, the isolation material is planarized so that top surfaces of the isolation material and top surfaces of fin structures 200 and planar portion 205 are substantially co-planar. In some embodiments, the isolation material is deposited with a flowable chemical vapor deposition process (e.g., FCVD) to ensure that the isolation material fills the space between fin structures 200 and planar portion 205 without forming seams or voids. In some embodiments, the isolation material is a silicon oxide based dielectric layer that includes, for example, nitrogen and hydrogen. To improve its dielectric and structural properties, the isolation material may be subjected to a wet steam anneal (e.g., exposed to 100% water molecules) at a temperature between about 800° C. and 1200° C. During the wet steam anneal, the isolation material densities and its oxygen content may increase. Subsequently, an etch-back process etches the isolation material below the top surfaces of fin structures 200 and planar portion 205 to form isolation structures 145 shown in FIG. 11.

Figure 12:
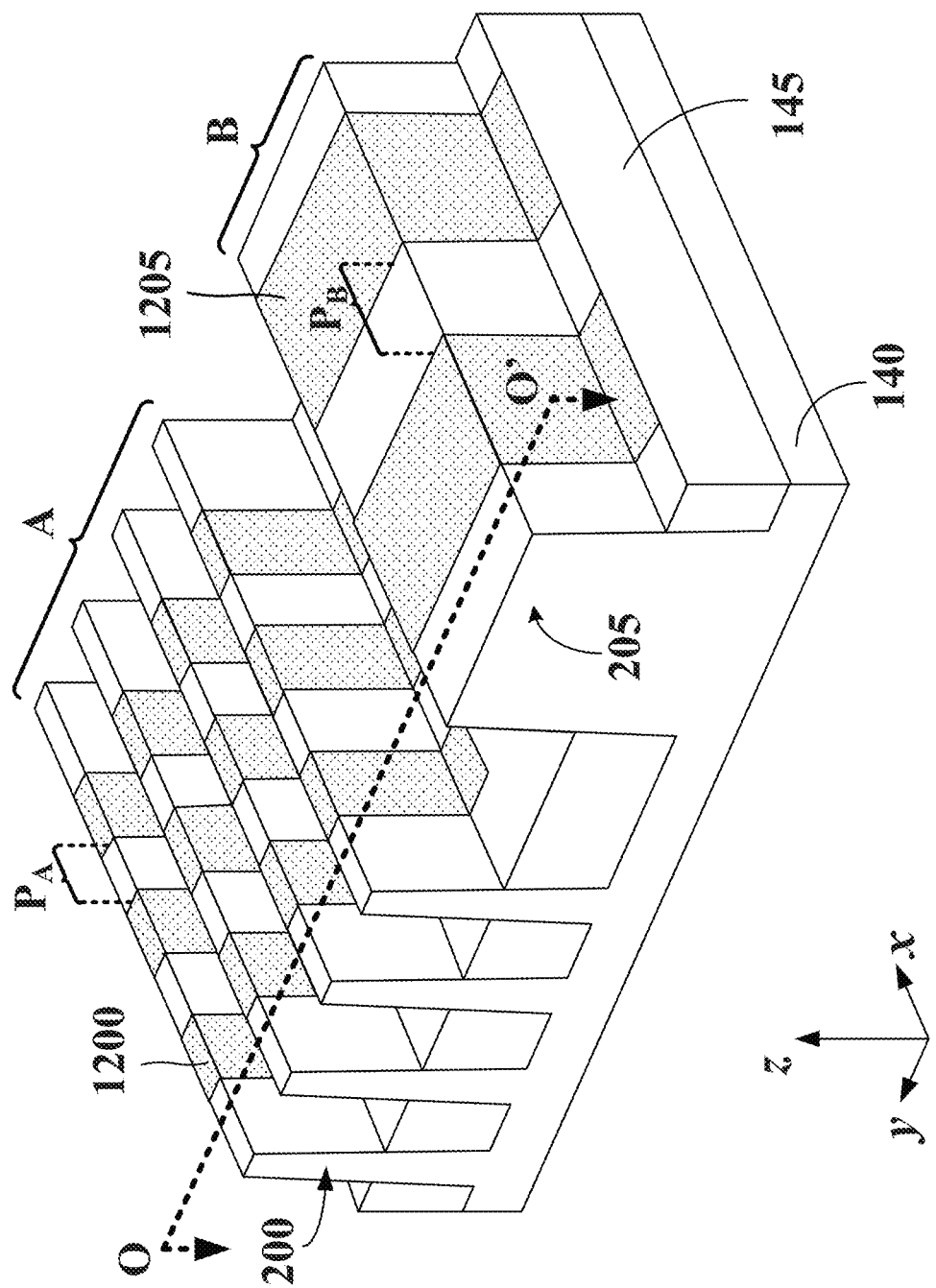
FIG. 12 is an isometric view of a non-I/O region and an I/O region after the formation sacrificial gate structures, in accordance with some embodiments.

In referring to FIG. 5A, method 500 continues with operation 510 and the process of forming sacrificial gate structures on non-I/O region A and I/O region B. In some embodiments, the sacrificial gate structures formed in non-I/O region A are narrower along the x-direction compared to the sacrificial gate structures formed in I/O region B. In some embodiments, the sacrificial gate structures formed in non-I/O region A have a different length along the y-direction from the sacrificial gate structures formed in I/O region B. By way of example and not limitation, FIG. 12 is an isometric view of non-I/O region A and I/O region B where shaded areas 1200 on fin structures 200 and shaded areas 1205 on planar portion 205 represent respective sacrificial gate structures, whose individual layers are not shown for simplicity and ease of description. In some embodiments, the sacrificial gate structures include a sacrificial gate dielectric (e.g., silicon oxide or silicon oxy-nitride) and a sacrificial gate electrode (e.g., polysilicon), both of which are sequentially deposited and patterned to form the sacrificial structures represented by shaded areas 1200 and 1205. In some embodiments, the number and the density of the sacrificial gate structures shown in FIG. 12 is not limiting and fewer or additional sacrificial gate structures are possible and within the spirit and the scope of this disclosure.

According to some embodiments, the S/D epitaxial structures in non-I/O region A and I/O region B are formed between the sacrificial gate structures represented by shaded areas 1200 and 1205, respectively. In some embodiments, the pitch or spacing between adjacent sacrificial gate structures is different between non-I/O region A and I/O region B due to the size difference between the sacrificial gate structures formed in non-I/O region A and I/O region B as discussed above. For example, pitch $P_A$ between adjacent sacrificial gate structures in non-I/O region A is shorter than pitch $P_B$ in I/O region B. In some embodiments, the height difference (e.g., $H_n$) between n-type S/D epitaxial structures 120 and 130, and the height difference (e.g., $H_p$) between p-type S/D epitaxial structures 125 and 135 shown in FIG. 1 is attributed to the size difference between pitch $P_A$ and pitch $P_B$.

In referring to FIG. 5A, method 500 continues with operation 515 and the process of recessing fin structures 200 in a first area of non-I/O region A and planar portion in a first area of FO region B. In some embodiments, the first areas of non-I/O region A and I/O region B are areas where n-type transistors are formed, like n-type transistors 100 and 110 shown in FIG. 1. Alternatively, the first area of non-I/O region A and I/O region B can be the areas where p-type transistors are formed, like p-type transistors 105 and 115 shown in FIG. 1. By way of example and not limitation, first area of non-I/O region A and first area of I/O region B will be described in the context of areas with n-type transistors, like n-type transistors 100 and 110 shown in FIG. 1. In some embodiments, recessing fin structures 200 in the first area of non-I/O region A and planar portion 205 in the first area of I/O region B is achieved by selectively masking substrate 140 except the first areas of non-I/O) region A and I/O region B. By way of example and not limitation, FIG. 13 is a cross-sectional view along cut-line OO' shown in FIG. 12 that shows non-I/O region A and I/O region B along the y-z plane.

In FIG. 13, which also includes an additional planar portion 205 as compared to FIG. 12, a masking layer 1300 covers substrate 140 except first area A1 of non-I/O region A and first area B1 of I/O region B. In some embodiments, masking layer 1300 masks each sacrificial gate structure in first areas A1 and B1 this is not shown in FIG. 13. Consequently, the recessing process of operation 515 occurs between the sacrificial gate structures e.g., between shaded areas 1200 and 1205 shown in FIG. 12. Since fin structures 200 are recessed in an area defined by pitch $P_A$, a first dimension of the recess is defined by the width of fin structures 200 along the y-direction and a second dimension of the recess is defined by pitch $P_A$ (e.g., by the spacing between adjacent sacrificial gate structures in first area A1 of non-I/O region A). Similarly, since planar portion 205 is recessed in an area defined by pitch $P_B$, a first dimension of the recess is defined by the width of planar portion 205 along the y-direction and a second dimension of the recess is defined by pitch $P_B$ (e.g., by the spacing between adjacent sacrificial gate structures in first area B1 of I/O region B).

In some embodiments, masking layer 1300 includes a hard mask material (e.g., silicon nitride) or a photoresist layer. Masking layer 1300 can be disposed on substrate 140 and subsequently patterned so that portions of the masking layer 1300 over first areas A1 and B1 are selectively removed to expose the underlying fin structures 200 and planar portion 205 as shown in FIG. 13.

Once fin structures 200 in first area A1 and planar portion in first area B1 are exposed, an etching process recesses (e.g., etches) the exposed fins and planar portion to reduce their height. In some embodiments, the recessed fin structures 200 and planar portion 205 are etched until their top surfaces are substantially co-planar to top surfaces of isolation structures 145 as shown in FIG. 14. In some embodiments, the etching process does not substantially etch masking layer 1300, the material of isolation structures 145, and the sacrificial gate structures. In some embodiments, the etching process is a dry etching process. By way of example and not limitation, the dry etching process can include an oxygen-containing gas, a fluorine-containing gas, a chlorine-containing gas, a bromine-containing gas, or combinations thereof. Examples of oxygen containing gases include, but are not limited to, oxygen ($O_2$) and sulfur dioxide ($SO_2$). Examples of fluorine-containing gases include, but are not limited to, carbon tetrafluoride ($CF_4$), sulfur hexafluoride ($SF_6$), difluoromethane ($CH_2F_2$), trifluoromethane ($CHF_3$), and hexafluoroethane ($C_2F_6$). Examples of chlorine-containing gases include, but are not limited to, chlorine ($Cl_2$), chloroform ($CHCl_3$), carbon tetrachloride ($CCl_4$), silicon tetrachloride ($SiCl_4$), and boron trichloride ($BCl_3$). Examples of bromine-containing gases include, but are not limited to, hydrogen bromide (HBr), and bromoform ($CHBr_3$).

Figure 15:
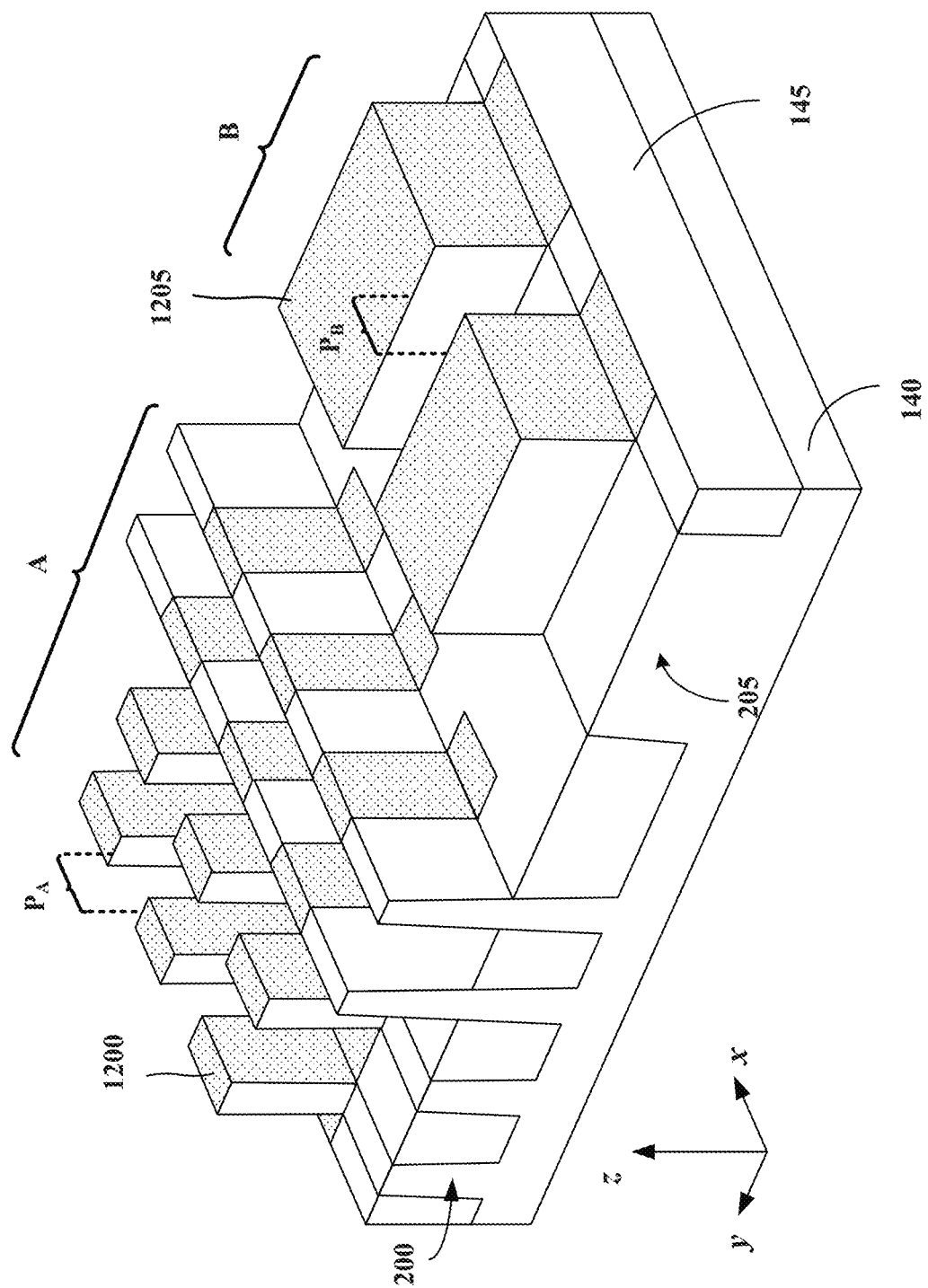
FIG. 15 is an isometric view of a non-I/O region and an I/O region after an etching operation, in accordance with some embodiments.
Figure 18:
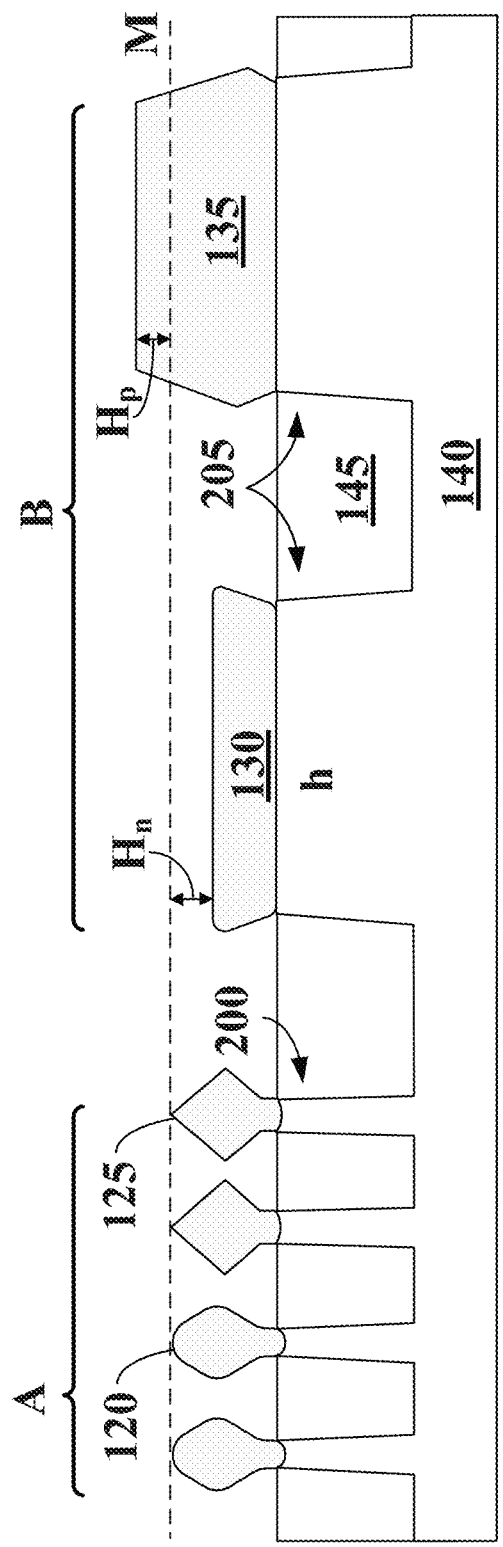
FIG. 18 is a cross-sectional view of S/D epitaxial structures formed at a substantially similar depth in non-I/O and I/O regions, in accordance with some embodiments.

In some embodiments, FIG. 15 is an isometric view of first area A1 of non-I/O region A and first area B1 of I/O region B after operation 515 described above. As shown in FIG. 15, operation 515 recesses fin structures 200 and planar portion 205 to the level of isolation structure 145. S/D epitaxial structures 120 and 130 will be formed on the recessed portions of fin structures 200 and planar portion 205, as discussed below.

In referring to FIG. 5, method 500 continues with operation 520 and the process of forming S/D epitaxial structures on recessed fin structures and planar portion—e.g., on recessed fin structures 200 in first area A1 and recessed planar portion 205 in first area B1. In some embodiments, the S/D epitaxial structures formed in operation 525 correspond to S/D epitaxial structures 120 and 130 shown in FIG. 1. By way of example and not limitation, S/D epitaxial structures 120 and 130 are formed concurrently on recessed fin structures 200 in first area A1 and recessed planar portion 205 in first area B1 respectively using a single deposition operation.

By way of example and not limitation, S/D epitaxial structures 120 and 130 can be formed as follows. In some embodiments, masking layer 1300 is not removed during operation 520. In referring to FIG. 16, S/D epitaxial structures 120 and 130 are grown on recessed fin structures 200 in first area A1 and on recessed planar portion 205 in first area B1 with a chemical vapor deposition (CVD) process using, for example, a silane ($SiH_4$) precursor. In some embodiments, recessed fin structures 200 in first area A1 and recessed planar portion 205 in first area B1 function as seed locations for S/D epitaxial structures 120 and 130. In some embodiments, S/D epitaxial structures 120 and 130 are not grown on dielectric surfaces, such as isolation structure 145 and sacrificial gate structures represented by shaded areas 1200 and 1205 shown in FIG. 15.

In some embodiments, S/D epitaxial structures 120 and 130 include arsenic-doped silicon (Si:As) epitaxial layers, phosphorous-doped silicon (Si:P) epitaxial layers, carbon-doped silicon (Si:C) epitaxial layers, or combinations thereof. The aforementioned dopants can be introduced during the epitaxial layer growth with the addition of appropriate precursors like phosphine, arsine, and hydrocarbons. By way of example and not limitation, Si:P and Si:As epitaxial layers can be deposited at temperatures of about 680° C., while Si:C epitaxial layers can be deposited at a temperature between about 600° C. and about 700° C. In some embodiments, the amount of phosphorous or arsenic incorporated into the epitaxial layers can be about $3\times10^{21}$ atoms/cm$^{-3}$. By way of example and not limitation, the concentration of C in Si:C can be equal to or less than about 5 atomic % (at. %). The aforementioned dopant and atomic concentrations are exemplary and not limiting. Therefore, different dopant and atomic concentrations can be used and are within the spirit and the scope of the disclosure.

In some embodiments, and due to the gate pitch difference between $P_A$ and $P_B$ discussed above, the etched portions of planar portion 205 in first area. B1 are wider in both x- and y-directions than the etched portions of fin structures 200 in first area A1. Consequently, and due to the growth kinetics of the epitaxial layer growth, n-type S/D epitaxial structures 130 are formed shorter than n-type S/D epitaxial structures 120 as discussed above with respect height difference $H_n$ shown in FIG. 1.

In some embodiments, the processes of operations 515 and 520 of method 500 are repeated for second areas of non-I/O region A and I/O region B where p-type transistors 105 and 115 are formed as discussed below.

In referring to FIG. 5, method 500 continues with operation 525 and the process of recessing fin structures 200 in a second area A2 of non-I/O region A and a planar portion 205 in a second area B2 of I/O region B. In some embodiments, second areas A2 and B2 are areas where p-type transistors are formed, like p-type transistors 105 and 115 shown in FIG. 1. In some embodiments, recessing fin structures 200 in second area A2 and planar portion 205 in second area B2 of I/O region B is achieved by selectively masking substrate 140 except second areas A2 and B2 e.g., the areas where p-type transistors are formed. For example, in referring to FIG. 17, a masking layer 1700 is disposed on substrate 140. Masking layer 1700 is patterned to expose second areas A2 and B2. At the same time, other areas of non-I/O region A and I/O region B are masked.

In some embodiments, the etching process of operation 525 is similar to the etching process of operation 515 discussed above. For example, the etching process of operation 525 can be a dry etching process that includes an oxygen-containing gas, a fluorine-containing gas, a chlorine-containing gas, a bromine-containing gas, or combinations thereof. Examples of oxygen containing gases include, but are not limited to, $O_2$ and $SO_2$. Examples of fluorine-containing gases include, but are not limited to, $CF_4$, $SF_6$, $CH_2F_2$, $CHF_3$, and $C_2F_6$. Examples of chlorine-containing gases include, but are not limited to, $Cl_2$, $CHCl_3$, $CCl_{14}$, $SiCl_4$, and $BCl_3$. Examples of bromine-containing gases include, but are not limited to, HBr, and $CHBr_3$.

In some embodiments, the recessed fin structures 200 and planar portion 205 are etched until their top surfaces are substantially co-planar to top surfaces of isolation structures 145 as shown in FIG. 17. In some embodiments, the etching process does not substantially etch masking layer 1700, the material of isolation structures 145, and the sacrificial gate structures.

In some embodiments, after operation 525 fin structures 200 and planar portion 205 are recessed in second areas A2 and B2 between the sacrificial gate structures (e.g., within pitch $P_A$ and pitch $P_B$) similar to operation 515 discussed above. For example, masking layer 1300 covers the sacrificial gate structures in second areas A2 and B2 during the etching processes of operation 525.

In referring to FIG. 5, method 500 continues with operation 530 and the process of forming S/D epitaxial structures on the recessed fin structures and the recessed planar portion—e.g., on recessed fin structures 200 in second area A2 and recessed planar portion 205 in second area B2. In some embodiments, the S/D epitaxial structures formed in operation 530 correspond to p-type S/D epitaxial structures 125 and 135 shown in FIG. 1. By way of example and not limitation, p-type S/D epitaxial structures 125 and 135 are formed concurrently on recessed fin structures 200 in second area A2 and recessed planar portion 205 in second area B2 using a single deposition operation.

By way of example and not limitation, p-type S/D epitaxial structures 125 and 135 can be formed as follows, P-type S/D epitaxial structures 125 and 135 are grown with a CVD process using, for example, $SiH_4$ and/or germane ($GeH_4$) precursors. In some embodiments, recessed fin structures 200 in second area A2 and recessed planar portion 205 in second area B2 function as seed locations for p-type S/D epitaxial structures 125 and 135. In some embodiments, p-type S/D epitaxial structures 125 and 135 are not grown on dielectric surfaces, such as isolation structure 145 and on sacrificial gate structures.

In some embodiments, p-type S/D epitaxial structures 125 and 135 include boron-doped (B-doped) silicon-germanium (SiGe:B) epitaxial layers, B-doped germanium (Ge:B) epitaxial layers, B-doped germanium-tin (GeSn:B) epitaxial layers, or combinations thereof. Boron dopants can be introduced during the epitaxial layer growth with appropriate precursors like diborane ($B_2H_6$). By way of example and not limitation. SiGe:B can be deposited at a temperature of about 620° C., GeSn:B epitaxial layers can be deposited at temperatures between about 300° C. and about 400° C., and Ge:B epitaxial layers can be deposited at a temperature between about 500° C. and about 600° C. By way of example and not limitation, the amount of boron incorporated into the aforementioned epitaxial layers can be about $1 \times 10^{21}$ atoms/cm$^{-3}$. In some embodiments, the concentration of Ge in SiGe:B can be between about 20 at. % and about 40 at. %. Further, the concentration of Sn in GeSn:B can be between about 5 at. % and about 10 at. %. The aforementioned dopant and atomic concentrations are exemplary and not limiting. Therefore, different dopant and atomic concentrations from the ones provided above can be used and are within the spirit and the scope of the disclosure.

In some embodiments, and due to the gate pitch difference between $P_A$ and $P_B$ discussed above, the etched portions of planar portion 205 in second area B2 are wider in both the x- and y-directions than the etched portions of fin structures 200 in second area A2. Consequently, and due to the growth kinetics of the epitaxial layer growth, p-type S/D epitaxial structures 135 are formed taller than n-type S/D epitaxial structures 125 as discussed above with respect to height difference $H_p$ shown in FIG. 1.

Figure 19A:
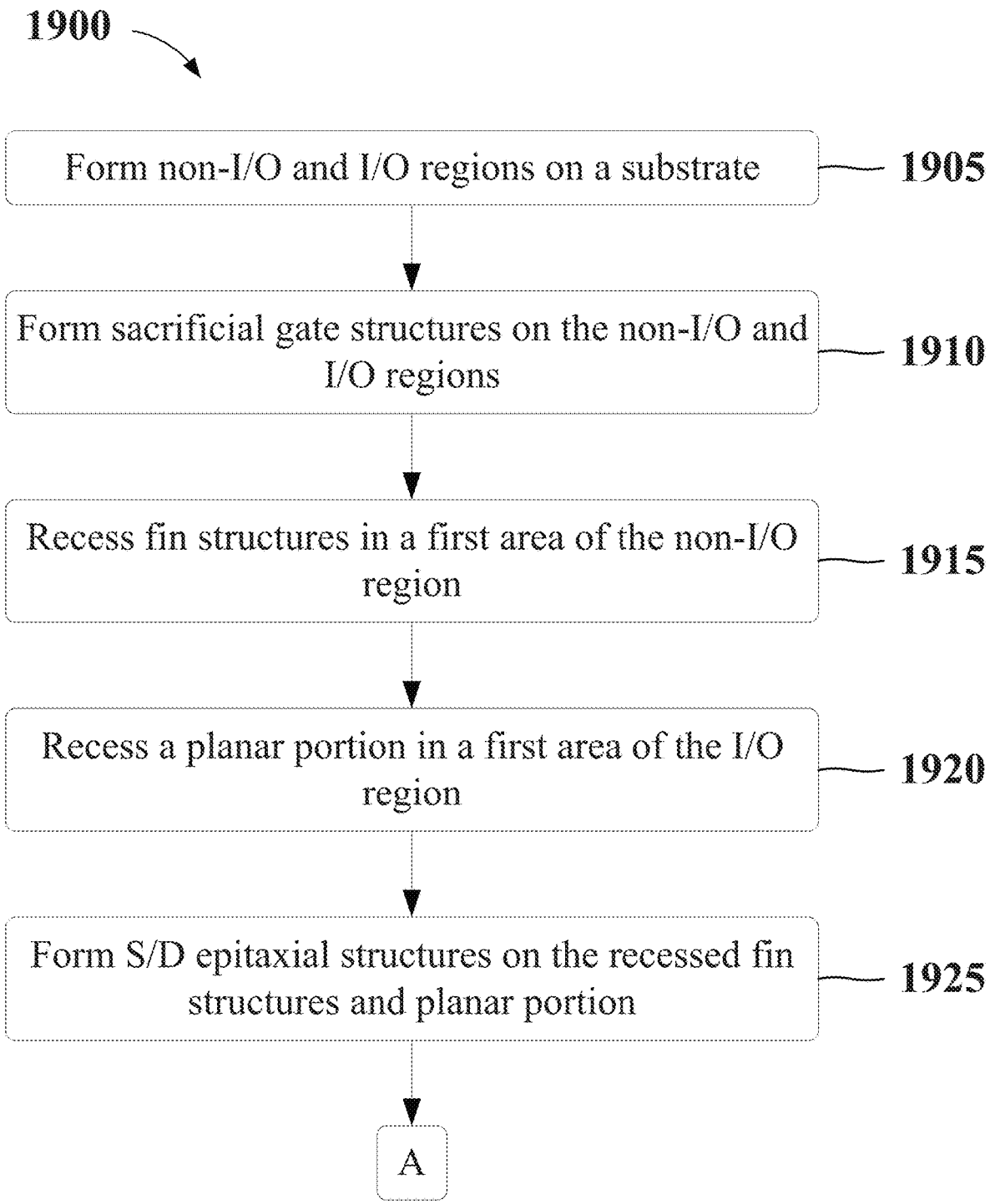
FIGS. 19A and 19B are flowcharts describing a method for forming S/D epitaxial structures with a co-planar top surface topography across non-I/O and I/O regions, in accordance with some embodiments.
Figure 19B:
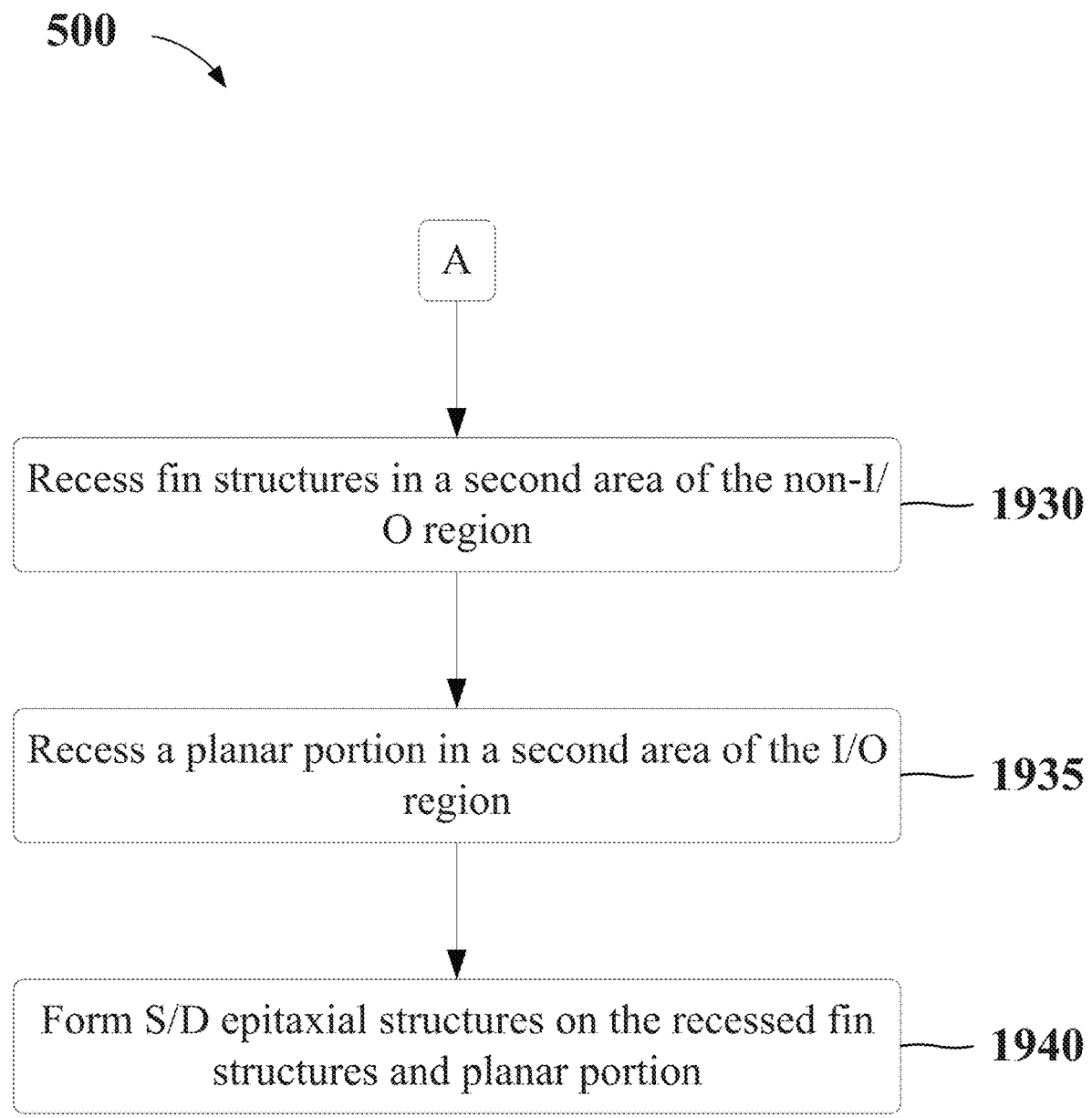

According to some embodiments, FIGS. 19A and 19B are flowcharts of a method 1900 for the formation of S/D epitaxial structures in non-I/O and I/O regions with substantially co-planar top surfaces, like S/D epitaxial structures 120, 125, 130 and 135 shown in FIG. 3. In some embodiments, a spacing between the S/D epitaxial structures and the channel regions in the I/O region is enlarged to mitigate the HCI effect. In some embodiments, S/D epitaxial structures of method 1900 are formed with additional etching masks. Other fabrication operations may be performed between the various operations of method 1900 and may be omitted merely for clarity. Method 1900 will be described in reference to FIGS. 20-28.

In some embodiments, operations 1905 and 1910 of method 1900 are identical to operations 505 and 510 of method 500 discussed above with respect to FIGS. 6-12. Therefore, the description of method 1900 will begin with operation 1915 and FIG. 20.

In referring to FIG. 19A, method 1900 continues with operation 1915 and the process of recessing fin structures 200 in a first area of non-I/O region A. In some embodiments, the first area of non-I/O region A is an area where n-type transistors are formed, like n-type transistor 100 shown in FIG. 3. Alternatively, the first area of non-I/O region A can be the area where p-type transistors are formed, like p-type transistor 100 shown in FIG. 3. By way of example and not limitation, first area of non-I/O region A will be described in the context of an area with n-type transistors, like n-type transistor 100 shown in FIG. 3. In some embodiments, recessing fin structures 200 in the first area of non-I/O region A is achieved by selectively masking substrate 140 except the first area of non-I/O region A—e.g., the area where n-type transistors are formed in non-I/O region A. By way of example and not limitation, FIG. 20 is a cross-sectional view along cut-line O-O' shown in FIG. 12 that shows non-I/O region A and I/O region B along the y-z plane.

Figure 20:
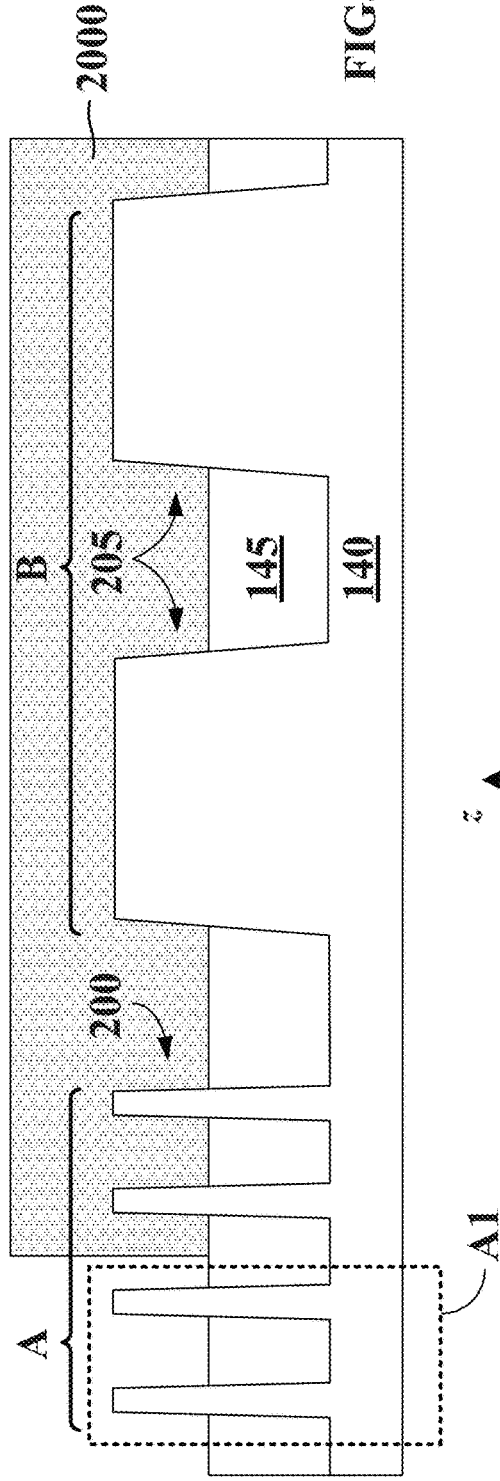
FIGS. 20-22 are cross-sectional views of intermediate structures during the formation of S/D epitaxial structures with a co-planar top surface topography across non-I/O and I/O regions, in accordance with some embodiments.

In FIG. 20, which also includes an additional planar portion 205 as compared to FIG. 12, a masking layer 1300 covers substrate 140 except a first area A1 of non-I/O region A. In some embodiments, masking layer 2000 masks each sacrificial gate structure in first area A1 of non-I/O region A and the entire I/O region B. Consequently, the recessing process of operation 1915 occurs between the sacrificial gate structures—e.g., between shaded areas 1200 shown in FIG. 12. Since fin structures 200 are recessed in an area defined by pitch $P_A$, a width of the recess is defined by the width of fin structures 200 along the y-direction and a length of the recess is defined by pitch $P_A$ (e.g., by the spacing between adjacent sacrificial gate structures in first area A1 of non-I/O region A).

In some embodiments, masking layer 2000 includes a hard mask material (e.g., silicon nitride) or a photoresist layer, which can be disposed on substrate 140 and subsequently patterned so that portions of the masking layer 2000 over first area A1 are selectively removed to expose the underlying fin structures 200 as shown in FIG. 20.

Figure 21:
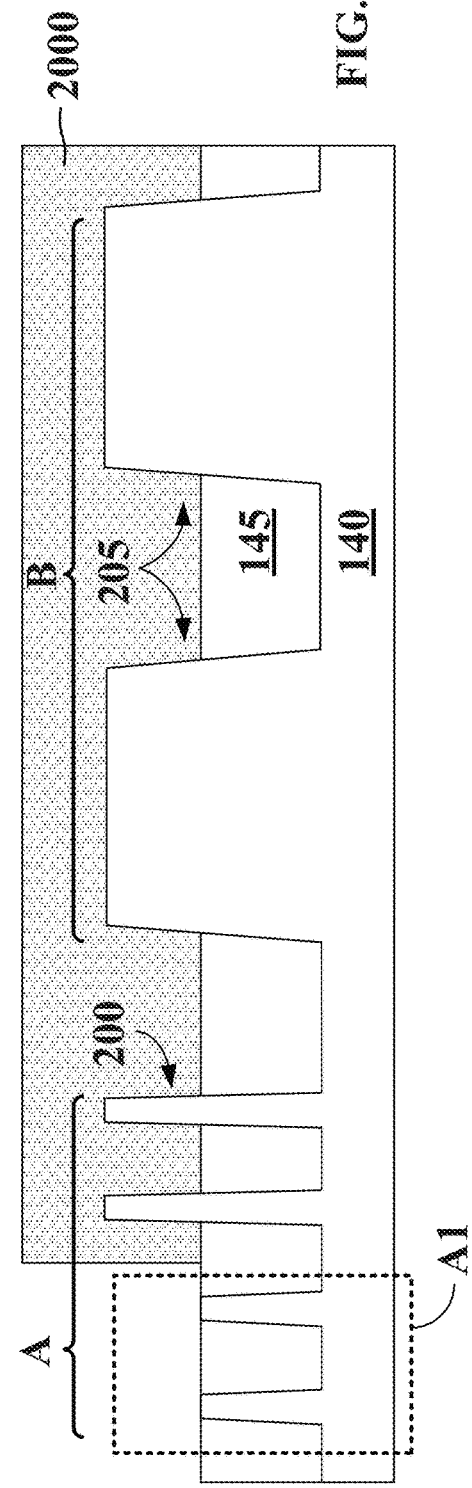
Figure 22:
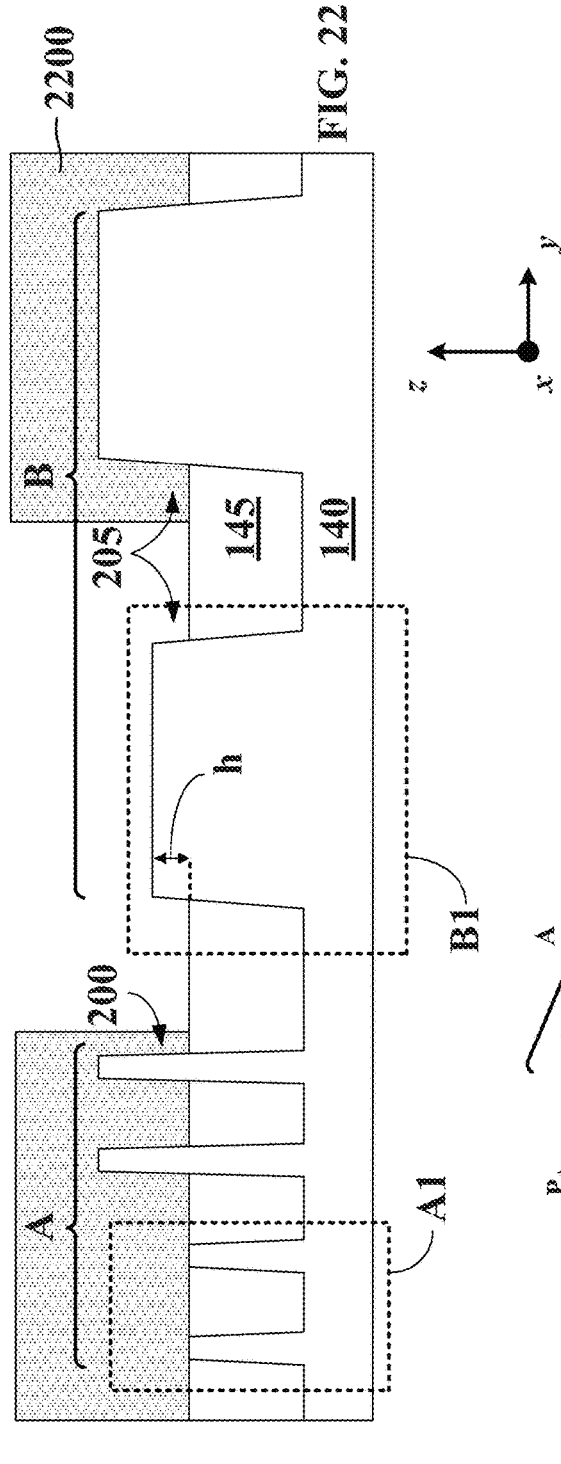

Once fin structures 200 in first area A1 are exposed, an etching process recesses (e.g., etches) the exposed fins to reduce their height. In some embodiments, the recessed fin structures 200 are etched until their top surfaces are substantially co-planar to top surfaces of isolation structures 145 as shown in FIG. 21. In some embodiments, the etching process does not substantially etch masking layer 2000, the material of isolation structures 145, and the sacrificial gate structures. In some embodiments, the etching process is a dry etching process similar to the etching process described above with respect to operation 515 of method 500. By way of example and not limitation, the dry etching process can include an oxygen-containing gas, a fluorine-containing gas, a chlorine-containing gas, a bromine-containing gas, or combinations thereof. Examples of oxygen containing gases include, but are not limited to, $O_2$ and $SO_2$. Examples of fluorine-containing gases include, but are not limited to, $CF_4$, $SF_6$, $CH_2F_2$, $CHF_3$, and $C_2F_6$. Examples of chlorine-containing gases include, but are not limited to, $Cl_2$, $CHCl_3$, $CCl_4$, $SiCl_4$, and $BCl_3$. Examples of bromine-containing gases include, but are not limited to, HBr, and $CHBr_3$. Once fin structures 200 in first area A1 are recessed between the sacrificial gate structures, masking layer 2000 is removed from both non-I/O region A and I/O region B.

In referring to FIG. 19A, method 1900 continues with operation 1920 and the process of recessing a planar portion 205 of substrate 140 in first area of region B. In some embodiments, the first area of I/O region B is an area where n-type transistors are formed, like n-type transistor 110 shown in FIG. 3. Alternatively, the first area of I/O region B can be the area where p-type transistors are formed, like p-type transistor 115 shown in FIG. 3. By way of example and not limitation, first area of I/O region B will be described in the context of an area where n-type transistors are formed, like n-type transistor 110 shown in FIG. 3.

In some embodiments, recessing a planar portion 205 in the first area of I/O region B is achieved by selectively masking substrate 140 except the first area of I/O region B. For example, and referring to FIG. 22, a masking layer 2200 can be disposed and patterned over substrate 140 so that first area B1 of I/O region B is exposed. In some embodiments, masking layer 2200 masks the sacrificial gate structures of first area B1 and exposes areas between the sacrificial gate structures, such as the areas defined by pitch $P_B$ shown in FIG. 12. Subsequently, an etching process, similar to the etching process described above with respect to operation 1915, is used to reduce the height of a planar portion 205 in first area B1 between the sacrificial gate structures. After the etching process, recessed planar portion 205 has a height h above the top surface of isolation structure 145 and the recessed fins 200 in first area A1. In some embodiments, height h corresponds to height difference $H_n$ between n-type epitaxial structures 120 and 130 shown in FIG. 1. In some embodiments, height h corresponds to depth difference $D_n$ between n-type epitaxial structures 120 and 130 shown in FIG. 3. In some embodiments, height h of the recessed planar portion 205 is adjusted to compensate for height difference $H_n$ shown in FIG. 1 and to achieve depth difference $D_n$ shown in FIG. 3 between n-type epitaxial structures 120 and 130. In some embodiments, height h achieves the top surface co-planarity shown in FIG. 3. In some embodiments, the etching process is timed to achieve the desired height h for the recess planar portion 205 in first region B1. In some embodiments, height h ranges between about 0 nm and about 30 nm (e.g., about 15 nm). In some embodiments, after the etching process of operation 1920, masking layer 2200 is removed with a dry etching or a wet etching process.

Figure 23:
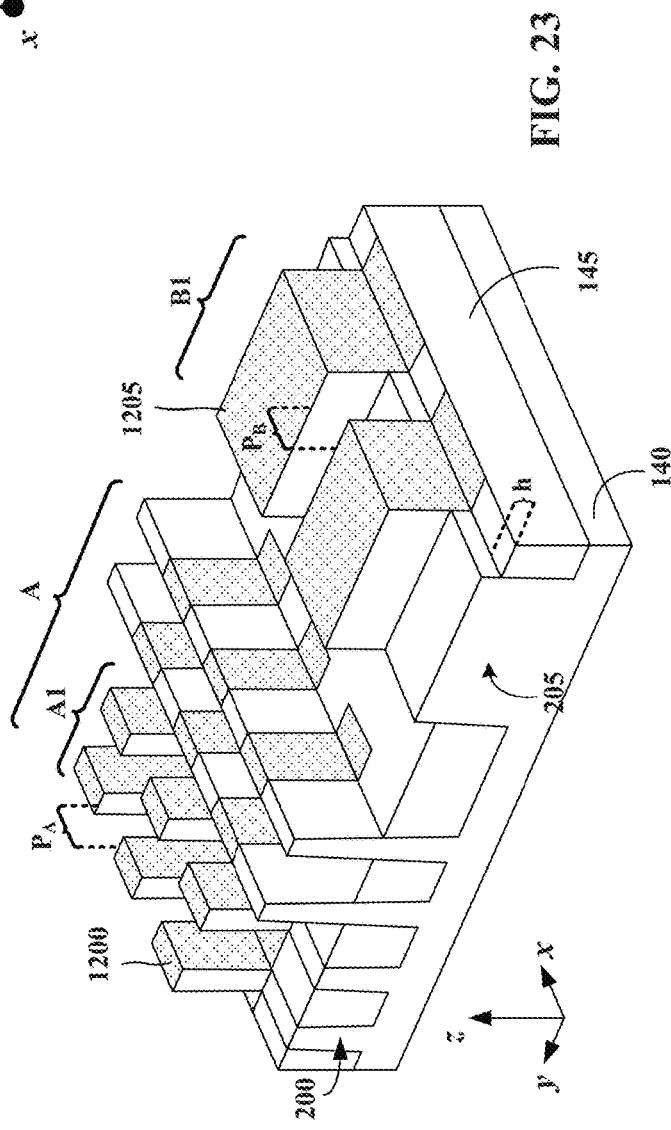
FIG. 23 is an isometric view of a non-I/O region and an I/O region after an etching operation, in accordance with some embodiments.
Figure 28:
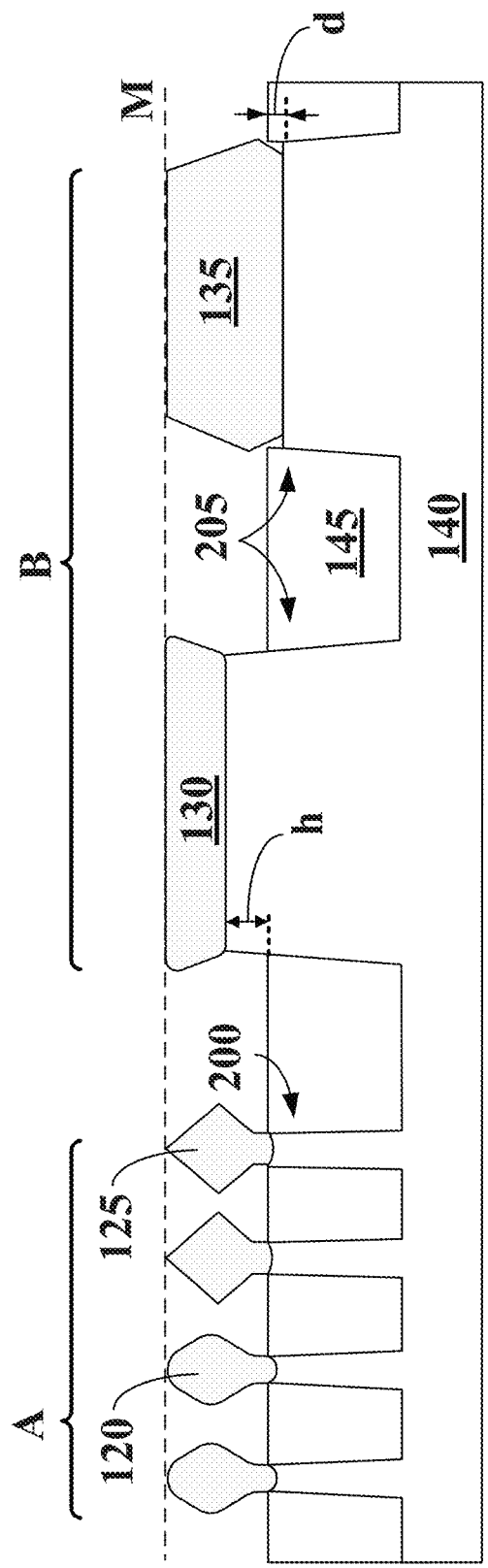
FIG. 28 is a cross-sectional view of a non-I/O region and an I/O region with S/D epitaxial structures having co-planar top surfaces, in accordance with some embodiments.

In some embodiments, FIG. 23 is an isometric view of first area A1 of non-I/O region A and first area B1 of I/O region B after operations 1915 and 1920 described above. As shown in FIG. 23, operations 1915 and 1920 recess fin structures 200 to the level of isolation structure 145 while planar portion 205 is recessed to height h above both isolation structure 145 and recessed fin structures 200 as discussed above with respect to FIG. 22. S/D epitaxial structures 120 and 130 will be formed on the recessed portions of fin structures 200 and planar portion 205, as discussed below.

In referring to FIG. 19A, method 1900 continues with operation 1925 and the process of forming S/D epitaxial structures on recessed fin structures and planar portion e.g., on recessed fin structures 200 in first area A1 and recessed planar portion 205 in first area B1. In some embodiments, the S/D epitaxial structures formed in operation 1925 correspond to S/D epitaxial structures 120 and 130 shown in FIG. 3. By way of example and not limitation, S/D epitaxial structures 120 and 130 are formed concurrently on recessed fin structures 200 in first area A1 and recessed planar portion 205 in first area B1 respectively using a single deposition operation.

In some embodiments, operation 1925 is similar to operation 530 of method 500 described above. For example, S/D epitaxial structures 120 and 130 can be formed as follows. In referring to FIG. 24, a masking layer 2400 is disposed and patterned on substrate 140 to mask substrate 140 except first areas A1 and B1. Subsequently, S/D epitaxial structures 120 and 130 are grown on recessed fin structures 200 in first area A1 and on recessed planar portion 205 in first area B1 with CVD process using, for example, $SiH_4$ precursor. In some embodiments, recessed fin structures 200 in first area A1 and recessed planar portion 205 in first area B1 function as seed locations for S/D epitaxial structures 120 and 130. In some embodiments, S/D epitaxial structures 120 and 130 are not grown on dielectric surfaces, such as isolation structure 145 and sacrificial gate structures represented by shaded areas 1200 and 1205 shown in FIG. 24.

In some embodiments, S/D epitaxial structures 120 and 130 include Si:As epitaxial layers, Si:P epitaxial layers, Si:C epitaxial layers, or combinations thereof. The aforementioned dopants can be introduced during the epitaxial layer growth with the addition of appropriate precursors like phosphine, arsine, and hydrocarbons. By way of example and not limitation, Si:P and Si:As epitaxial layers can be deposited at temperatures of about 680° C. while Si:C epitaxial layers can be deposited at a temperature between about 600° C. and about 700° C. In some embodiments, the amount of phosphorous or arsenic incorporated into the epitaxial layers can be about $3 \times 10^{21}$ atoms/cm$^{-3}$. By way of example and not limitation, the concentration of C in Si:C can be equal to or less than about 5 atomic % (at. %). The aforementioned dopant and atomic concentrations are exemplary and not limiting. Therefore, different dopant and atomic concentrations can be used and are within the spirit and the scope of the disclosure.

In some embodiments, and due to the gate pitch difference between $P_A$ and $P_B$ discussed above, the etched portions of planar portion 205 in first area B1 are wider in both x- and y-directions than the etched portions of fin structures 200 in first area A1. Consequently, and due to the growth kinetics of the epitaxial layer growth, n-type S/D epitaxial structures 130 are formed with a shorter height than n-type S/D epitaxial structures 120 as discussed above. However, due to height offset h between recess fin structures 200 and recessed planar portion 205, top surfaces of n-type S/D epitaxial structures 120 and 130 are grown to the same horizontal level (e.g., co-planar to one another) as shown by line M in FIG. 24. As discussed above, height h compensates for the height difference between n-type S/D epitaxial structures 130 and 120 to achieve the top surface co-planarity shown in FIGS. 3 and 27. Therefore, height h is substantially equal to height difference $H_n$ shown in FIG. 1 and to depth difference $D_n$ shown in FIG. 3 as discussed above.

In some embodiments, the processes of operations 1915 and 1920 of method 1900 are repeated for second areas of non-I/O region A and I/O region B where p-type transistors 105 and 115 are formed. However, in the second area, planar portion 205 is etched below isolation structure 145 as discussed below.

In some embodiments, after operation 1925, masking layer 2400 is removed. By way of example and not limitation, masking layer 2400 can be removed with a wet etching process or a dry etching process selective to masking layer 2400.

In referring to FIG. 19B, method 1900 continues with operation 1930 and the process of recessing fin structures 200 in a second area A2 of non-I/O region A. In some embodiments, the second area A2 is an area where p-type transistors are formed, like p-type transistor 105 shown in FIG. 3. In some embodiments, recessing fin structures 200 in second area A2 is achieved by selectively masking substrate 140 except second area A2—e.g., the area where p-type transistors are formed. For example, in referring to FIG. 25, a masking layer 1500 is disposed on substrate 140. Masking layer 2500 is patterned to expose second area A2. At the same time, other areas of non-I/O region A and I/O region B are masked.

In some embodiments, the etching process used to recess fin structures 200 in second area A2 is similar to the one used to recess fin structures 200 in first area A1 discussed above. For example, the etching process is a dry etching process. By way of example and not limitation, the dry etching process can include an oxygen-containing gas, a fluorine-containing gas, a chlorine-containing gas, a bromine-containing gas, or combinations thereof. Examples of oxygen containing gases include, but are not limited to, $O_2$ and $SO_2$. Examples of fluorine-containing gases include, but are not limited to, $CF_4$, $SF_6$, $CH_2F_2$, $CHF_3$, and $C_2F_6$. Examples of chlorine-containing gases include, but are not limited to, $Cl_2$, $CHCl_3$, $CCl_{14}$, $SiCl_4$, and $BCl_3$. Examples of bromine-containing gases include, but are not limited to, HBr, and $CHBr_3$. Once fin structures 200 in second area A2 are recessed (e.g., between the sacrificial gate structures), masking layer 2500 is removed from both non-I/O region A and I/O region B. By way of example and not limitation, masking layer 2500 can be removed with a wet etching process or a dry etching process selective to masking layer 2500.

In some embodiments, the recessed fin structures 200 are etched until their top surfaces are substantially co-planar to top surfaces of isolation structures 145 as shown in FIG. 25. In some embodiments, the etching process does not etch masking layer 2500, the material of isolation structures 145, and the layers of the sacrificial gate structure.

In referring to FIG. 19B, method 1900 continues with operation 1935 and the process of recessing a planar portion in a second area of I/O region B. In some embodiments, operation 1935 is similar to operation 1920 described above with the exception that a different area of I/O region B is etched (e.g., recessed) and the recessed planar portion is etched to a depth below isolation structure 145 instead to a height h above isolation structure 145. Further, similar masking operations used in operation 1920 can be used in operation 1935. For example, and in referring to FIG. 26, a masking layer 2600 is disposed on substrate 140. Masking layer 2600 is patterned to expose second area B2 of I/O region B. At the same time, other areas of non-I/O region A and I/O region B are masked.

In some embodiments, the etching process used to recess planar portion 205 in second area B2 is similar to the one used to recess planar portion 205 in first area B1 discussed above. After the etching process, recessed planar portion 205 has a depth d below the top surface of isolation structure 145. In some embodiments, depth d corresponds to height difference $H_p$ between p-type epitaxial structures 125 and 135 shown in FIG. 1. In some embodiments, depth d corresponds to depth difference $D_p$ between p-type epitaxial structures 125 and 135 shown in FIG. 3. In some embodiments, depth d of the recessed planar portion 205 is adjusted to compensate for height difference $H_p$ shown in FIG. 1 and to achieve depth difference $D_p$ shown in FIG. 3 between p-type epitaxial structures. In some embodiments, depth d achieves the top surface co-planarity shown in FIG. 3. In some embodiments, the etching process is timed to achieve the desired depth d for the recess planar portion 205 in second region B2. In some embodiments, depth d ranges between about 0 nm and about 30 nm (e.g., about 10 nm). In some embodiments, after the etching process of operation 1935, masking layer 1900 is removed.

In some embodiments, operations 1930 and 1935 recess fin structures 200 and planar portion 205 in second areas A2 and B2 between the sacrificial gate structures (e.g., within pitch $P_A$ and pitch $P_B$) as discussed above with respect to operations 1915 and 1920. For example, masking layers 2500 and 1900 cover the sacrificial gate structures in second areas A2 and B2 during the etching processes in operations 1930 and 1935.

In referring to FIG. 19B, method 1900 continues with operation 1940 and the process of forming SIT) epitaxial structures on the recessed fin structures and the recessed planar portion—e.g., on recessed fin structures 200 in second area A2 and recessed planar portion 205 in second area B2. In some embodiments, the S/D epitaxial structures formed in operation 1940 correspond to p-type S/D epitaxial structures 125 and 135 shown in FIG. 3. By way of example and not limitation, p-type S/D epitaxial structures 125 and 135 are formed concurrently on recessed fin structures 200 in second area A2 and recessed planar portion 205 in second area B2 using a single deposition operation.

By way of example and not limitation, p-type S/D epitaxial structures 125 and 135 can be formed as follows. In referring to FIG. 27, a masking layer 2700 is disposed and patterned on substrate 140 to mask substrate 140 except second areas A2 and B2. Subsequently, p-type S/D epitaxial structures 125 and 135 are grown on recessed fin structures 200 in second area A2 and on recessed planar portion 205 in second area. B2 with a CVD process using, for example, $SiH_4$ and/or $GeH_4$ precursors. In some embodiments, recessed fin structures 200 in second area A2 and recessed planar portion 205 in second area B2 function as seed locations for p-type S/D epitaxial structures 125 and 135. In some embodiments, p-type S/D epitaxial structures 125 and 135 are not grown on dielectric surfaces, such as isolation structure 145 and on sacrificial gate structures.

In some embodiments, p-type S/D epitaxial structures 125 and 135 include SiGe:B epitaxial layers, Ge:B epitaxial layers, GeSn:B, or combinations thereof. Boron dopants can be introduced during the epitaxial layer growth with appropriate precursors like $B_2H_6$. By way of example and not limitation, SiGe:B can be deposited at a temperature of about 620° C., GeSn:B epitaxial layers can be deposited at temperatures between about 300° C. and about 400° C., and Ge:B epitaxial layers can be deposited at a temperature between about 500° C. and about 600° C. By way of example and not limitation, the amount of boron incorporated into the aforementioned epitaxial layers can be about $1 \times 10^{21}$ atoms/cm$^{-3}$. In some embodiments, the concentration of Ge in SiGe:B can be between about 20 at. % and about 40 at. %. Further, the concentration of Sn in GeSn:B can be between about 5 at. % and about 10 at. %. The aforementioned dopant and atomic concentrations are exemplary and not limiting. Therefore, different dopant and atomic concentrations from the ones provided above can be used and are within the spirit and the scope of the disclosure.

In some embodiments, and due to the gate pitch difference between $P_A$ and $P_B$ discussed above, the etched portions of planar portion 205 in second area B2 are wider in both the x- and y-directions than the etched portions of fin structures 200 in second area A2. Consequently, and due to the growth kinetics of the epitaxial layer growth, p-type S/D epitaxial structures 135 are formed with a taller height than n-type S/D epitaxial structures 125 as discussed above. However, due to depth offset d between recessed fin structures 200 and recessed planar portion 205, top surfaces of p-type S/D epitaxial structures 125 and 135 are grown to the same horizontal level (e.g., co-planar) as shown by line M in FIG. 28. As discussed above, depth d compensates for the height difference between p-type epitaxial structures 125 and 135 to achieve the top surface co-planarity shown in FIGS. 3 and 28. Therefore, depth d is substantially equal to height difference $H_p$ shown in FIG. 1 and to depth difference $D_p$ shown in FIG. 3.

In some embodiments, the etching processes used in operations 1920 and 1935 can be tuned to increase the distance of n-type and p-type S/D epitaxial structures 125 and 135 from their respective transistor channel regions as discussed with respect to FIGS. 4A and 4B. In some embodiments, the etching processes used in operations 1920 and 1935 include isotropic and anisotropic components, which can be independently tuned or turned off during the etching process.

Figure 29A:
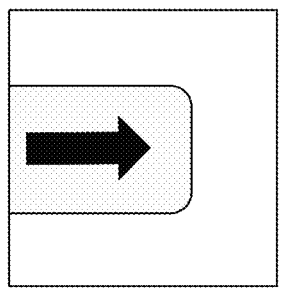
FIGS. 29A and 29B are etching profiles achieved by isotropic and anisotropic etching processes, in accordance with some embodiments.

An etching process with anisotropic and isotropic components removes material in all directions as indicated by the directional arrows in FIG. 29A. A process with anisotropic and isotropic components results in an S/D opening with a sidewall profile like S/D opening 2900 shown in FIG. 29C. In some embodiments, S/D opening 2900 has a sidewall angle θ that ranges from about 0° to about 90°. Due to its sidewall profile, S/D opening 2900 is formed in close proximity to the channel region, which is formed under gate structure 2205 when the transistor is turned on. In FIG. 29C, the proximity of the S/D structures to the channel region can be defined by a horizontal distance S1 measured between a sidewall edge of S/D opening 2900 and the channel region (e.g., the edge of gate structure 2905). In some embodiments, the HCI effect depends on horizontal distance S1 and is stronger for small S1 values and weaker for large S1 values.

Figure 29B:
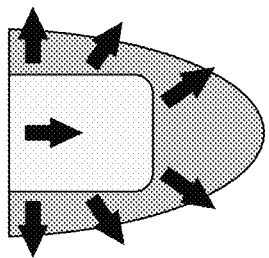
Figure 29C:
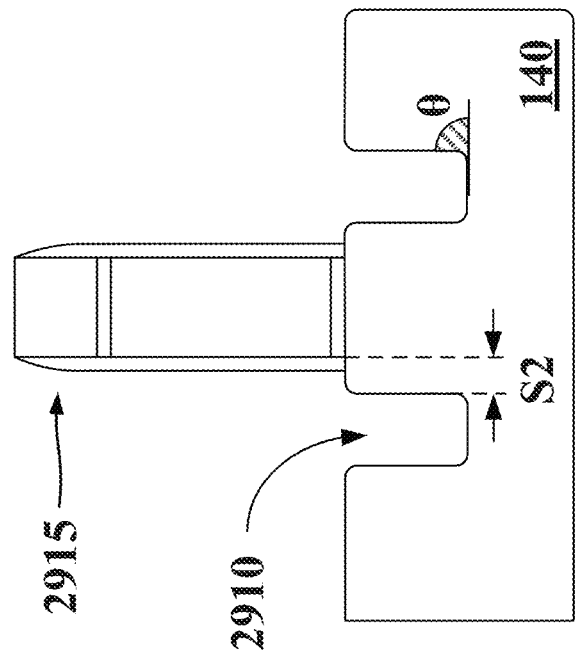
FIGS. 29C and 29D are cross-sectional views of S/D openings formed with different etching processes, in accordance with some embodiments.
Figure 29D:
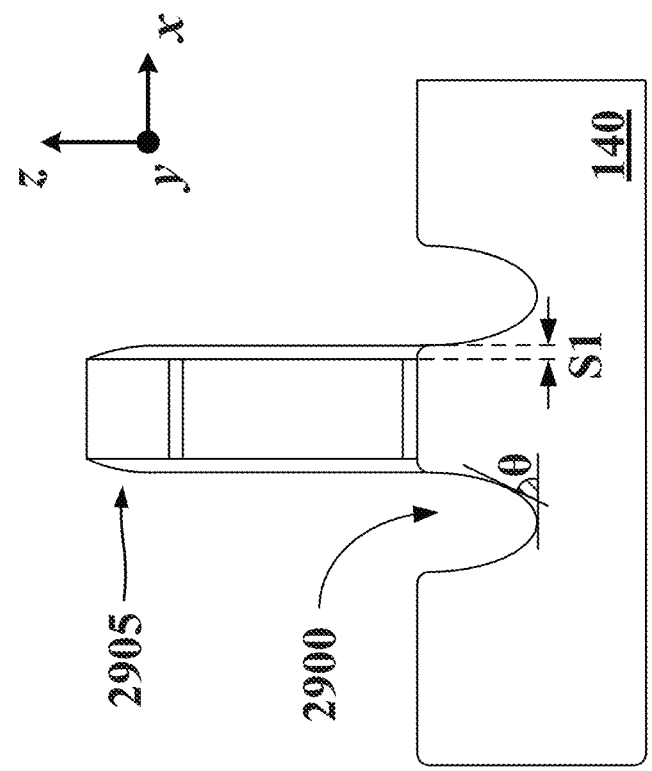

On the other hand, an etching process free from an isotropic component or an etching process with a dominant anisotropic component removes material preferentially along the vertical direction (e.g., the z-axis) as shown in FIG. 29B. An etching process, which is free from an isotropic component or has a dominant anisotropic component, can result in an S/D opening like S/D opening 2910 shown in FIG. 29D. According to some embodiments, S/D opening 2910 has a substantially vertical sidewall profile with a sidewall angle θ of about 90°, according to some embodiments. Due to its vertical sidewall profile, S/D opening 2910 is spaced apart from the channel region by a horizontal distance S2 greater than horizontal distance S1 (e.g., S2>S1). In some embodiments, the proximity grain (e.g., S2−S1) that can be achieved for n-type S/D epitaxial structures 130 is about 2.8 nm. In some embodiments, the proximity grain (e.g., S2−S1) that can be achieved for p-type S/D epitaxial structures 135 is about 6 nm.

As discussed above, the effect of HCI for the transistors in I/O region B can be alleviated by adjusting the horizontal distance between each S/D opening (e.g., as formed by operations 1920 and 1935) and the channel region. According to some embodiments, the etching processes described in method 1900 can be different between non-I/O and I/O regions, which provide independent control of the spacing between the S/D epitaxial structures and the transistor's channel region. In addition, method 1900 enables the formation of S/D epitaxial structures with co-planar top surfaces and the fabrication of S/D contacts with substantially similar heights in non-I/O and I/O regions of the substrate.

In some embodiments, the order of operations in method 1900 can be different from the one described above. For example, operation 1925 can be performed after operation 1935 and prior to operation 1940. Further, since the fin structures in first and second areas A1 and A2 are etched by the same amount, operations 1915 and 1930 can be performed in a single operation with one photomask. Therefore, permutations and combination of the operations in method 1900 are possible and within the spirit and the scope of this disclosure.

In some embodiments, methods 500 and 1900 are performed on the same substrate. For example, method 500 can be used to form a first I/O region and a non-I/O region on a substrate and method 1900 can be used to form a second I/O region and a non-I/O region on the substrate. Further, the etching processes used in operations 1920 and 1935 can be adjusted to alleviate the HCI effect for selected transistors in the second I/O region of the substrate.

Embodiments of the present disclosure are directed to a method for the formation of n-type and p-type epitaxial structures with substantially co-planar top surfaces and different depths across non-I/O and I/O regions of a substrate. Consequently, S/D contacts in non-I/O and I/O regions have a substantially similar height. In some embodiments, the above benefits are realized with the use of additional etching masks, which decouple the etching processes between I/O and non-I/O regions of the substrate. Further, independent control of the etching processes for n-type and p-type S/D epitaxial structures within the I/O region of the substrate is possible. In some embodiments, mitigation of the HCI effect can also be achieved by modulating the sidewall profile of S/D openings in I/O FETs to increase the spacing between the S/D epitaxial structures and the channel region.

In some embodiments, a method includes forming, on a substrate, a first region with fin structures and a second region with a planar portion having a first height. The method further includes forming, on the substrate, an isolation structure that covers bottom portions of the fin structures and the planar portion. Further, the method includes forming first gate structures on the fin structures and second gate structures on the planar portion, where the first gate structures are spaced apart by a first pitch and the second gate structures are spaced apart by a second pitch larger than the first pitch. The method also includes, etching the fin structures between the first gate structures until top surfaces of the etched fin structures are co-planar with top surfaces of the isolation structure and reducing the first height of the planar portion between the second gate structures to a second height. Finally, the method includes forming first epitaxial structures on the etched fin structures and forming second epitaxial structures on the etched planar portion, where top surfaces of the first and second epitaxial layers are substantially co-planar.

In some embodiments, a structure includes a first region with first transistors and a second region with second and third transistors, where S/D epitaxial layers of the first transistors have a first height and S/D epitaxial layers of the second transistors have a second height shorter than the first height. Further, S/D epitaxial layers of the third transistor have a third height taller than the first height and top surfaces of the S/D epitaxial layers of the first, second, and third transistors are substantially co-planar.

In some embodiments, a method includes forming a first region with fin structures and a second region with a planar portion on a substrate. Further, the method includes forming first gate structures on the fin structures and second gate structures on the planar portion. The method also includes etching the fin structures between the first gate structures to form first openings and etching the planar portion between the second gate structures to form second openings, where the second openings are larger than the first openings. Finally, the method includes forming first epitaxial structures in the first openings and second epitaxial structures in the second openings, where top surfaces of the first and second epitaxial structures are substantially co-planar and bottom surfaces of the first and second epitaxial structures are not co-planar.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming, on a substrate, a first region comprising fin structures;
    forming, on the substrate, a second region comprising a planar portion with a first height;
    forming, on the substrate, an isolation structure that covers a bottom portion of the fin structures and of the planar portion;
    forming, on the fin structures, first gate structures spaced apart by a first pitch;
    forming, on the planar portion, second gate structures spaced apart by a second pitch larger than the first pitch;
    etching the fin structures between the first gate structures until top surfaces of the etched fin structures are co-planar with top surfaces of the isolation structure;
    reducing the first height of the planar portion between the second gate structures to a second height;
    forming first epitaxial structures on the etched fin structures; and
    forming, on the etched planar portion, second epitaxial structures with top surfaces substantially co-planar with top surfaces of the first epitaxial structures.

2. The method of claim 1, wherein forming the first region comprises etching the substrate to form the fin structures.

3. The method of claim 1, wherein forming the second region comprises etching the substrate to form the planar portion.

4. The method of claim 1, wherein etching the fin structures comprises reducing a height of the fin structures below the second height.

5. The method of claim 1, wherein etching the fin structures comprises reducing a height of the fin structures above the second height.

6. The method of claim 1, wherein reducing the first height to the second height comprises etching the planar portion so that a top surface of the planar portion is above the isolation structure.

7. The method of claim 1, wherein reducing the first height to the second height comprises etching the planar portion so that a top surface of the planar portion is below the isolation structure.

8. The method of claim 1, wherein forming the first and the second epitaxial structures comprises forming the first epitaxial structures taller than the second epitaxial structures.

9. The method of claim 1, wherein forming the first and the second epitaxial structures comprises forming the first epitaxial structures shorter than the second epitaxial structures.

10. A method, comprising:
    forming, on a substrate, a first region comprising fin structures having a first width;
    etching the substrate to form a planar portion in a second region, wherein the planar portion comprises top and sidewall surfaces above the substrate, the top surface of the planar portion is substantially co-planar with topmost surfaces of the fin structures, and the planar portion has a second width different from the first width;

forming first gate structures spaced apart by a first pitch on top and sidewall surfaces of the fin structures;

forming second gate structures spaced apart by a second pitch on the top and sidewall surfaces of the planar portion, wherein the second pitch is greater than the first pitch;

etching the fin structures between the first gate structures to form first openings;

etching the planar portion between the second gate structures to form second openings, wherein the second openings are larger than the first openings;

forming first epitaxial structures in the first openings; and forming second epitaxial structures in the second openings, wherein top surfaces of the first and second epitaxial structures are substantially co-planar and bottom surfaces of the first and second epitaxial structures are not co-planar.

11. The method of claim 10, wherein etching the planar portion comprises forming the second openings with a substantially anisotropic etching process.

12. The method of claim 10, wherein etching the planar portion comprises forming the second openings with a sidewall angle of about 900 between sidewall and bottom surfaces of the second openings.

13. The method of claim 10, wherein etching the fin structures and the planar portion comprises forming the second openings with a height that is different from that of the first openings.

14. A method, comprising:

concurrently forming fin structures in a first region and planar portions in a second region on a substrate, wherein the planar portions are wider than the fin structures and comprise top and sidewall surfaces above the substrate;

forming, on the substrate, an isolation structure surrounding sidewall surfaces of the fin structures and the sidewall surfaces of the planar portions, wherein top surfaces of the isolation structure in the first and second regions are coplanar;

forming first gate structures spaced apart by a first pitch on top and sidewall surfaces of the fin structures;

forming second gate structures spaced apart by a second pitch on the top and sidewall surfaces of the planar portions, wherein the second pitch is greater than the first pitch;

removing a portion of the fin structures between the first gate structures to form first openings such that top surfaces of a remaining portion of the fin structures are co-planar with the top surfaces of the isolation structure adjacent to the remaining portion;

removing a portion of the planar portions between the second gate structures to form second openings, wherein bottom surfaces of the first openings are at a level different from bottom surfaces of the second openings; and epitaxially growing epitaxial structures in the first and second openings concurrently.

15. The method of claim 14, wherein epitaxially growing the epitaxial structures in the first and second openings concurrently comprises concurrently growing the epitaxial structures on the fin structures and the planar portions having substantially coplanar top surfaces.

16. The method of claim 14, wherein epitaxially growing the epitaxial structures in the first and second openings concurrently comprises:

growing first epitaxial structures having a first height on the fin structures; and growing second epitaxial structures having a second height on the planar portions, wherein the second height is different from the first height.

17. The method of claim 14, wherein concurrently forming the first region and the second region comprises etching the substrate to form the fin structures and the planar portions.

18. The method of claim 14, wherein removing the portion of the planar portions comprises forming the second openings with a substantially anisotropic etching process.

19. The method of claim 14, wherein removing the portion of the planar portions comprises etching the planar portions so that top surfaces of the planar portions are above top surfaces of the fin structures.

20. The method of claim 14, wherein removing the portion of the planar portions comprises etching the planar portions so that top surfaces of the planar portions are below top surfaces of the fin structures.

* * * * *